United States Patent
Lambert et al.

(10) Patent No.: US 12,288,750 B2
(45) Date of Patent: Apr. 29, 2025

(54) CONFORMAL POWER DELIVERY STRUCTURE FOR DIRECT CHIP ATTACH ARCHITECTURES

(71) Applicant: Intel Corporation, Santa Clara, CA (US)

(72) Inventors: William J. Lambert, Tempe, AZ (US); Beomseok Choi, Chandler, AZ (US); Krishna Bharath, Phoenix, AZ (US); Kaladhar Radhakrishnan, Chandler, AZ (US); Adel Elsherbini, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 692 days.

(21) Appl. No.: 17/485,208

(22) Filed: Sep. 24, 2021

(65) Prior Publication Data

US 2023/0097714 A1 Mar. 30, 2023

(51) Int. Cl.
*H01L 23/538* (2006.01)
*H01L 23/00* (2006.01)
*H01L 25/065* (2023.01)

(52) U.S. Cl.
CPC ...... *H01L 23/5386* (2013.01); *H01L 23/5381* (2013.01); *H01L 23/5383* (2013.01);
(Continued)

(58) Field of Classification Search
CPC ........... H01L 24/34; H01L 2027/11881; H01L 29/66295; H01L 2224/37
See application file for complete search history.

(56) References Cited

U.S. PATENT DOCUMENTS

| | | | |
|---|---|---|---|
| 6,803,649 B1 * | 10/2004 | He | H01L 23/50 257/E23.067 |
| 2012/0199386 A1 * | 8/2012 | Adachi | H05K 3/445 174/258 |

(Continued)

OTHER PUBLICATIONS

"Cold Spraying;" Wikipedia, as accessed Oct. 28, 2021 at https://en.wikipedia.org/wiki/Cold_spraying, 6 pages.
(Continued)

*Primary Examiner* — Dale E Page
*Assistant Examiner* — Lawrence C Tynes, Jr.
(74) *Attorney, Agent, or Firm* — Alliance IP, LLC

(57) ABSTRACT

In one embodiment, a base die apparatus includes a conformal power delivery structure comprising a first electrically conductive layer defining one or more recesses, and a second electrically conductive layer at least partially within the recesses of the first electrically conductive layer and having a lower surface that generally conforms with the upper surface of the first electrically conductive layer. The conformal power delivery structure also includes a dielectric material between the surfaces of the first electrically conductive layer and the second electrically conductive layer that conform with one another. The conformal power delivery structure may be connected to connection pads of the base die apparatus, e.g., to provide power delivery to integrated circuit (IC) chips connected to the base die apparatus. The base die apparatus also includes bridge circuitry to connect IC chips with one another.

25 Claims, 15 Drawing Sheets

(52) U.S. Cl.
CPC .......... *H01L 24/16* (2013.01); *H01L 25/0655* (2013.01); *H01L 2224/16227* (2013.01); *H01L 2924/1427* (2013.01)

(56) References Cited

U.S. PATENT DOCUMENTS

| | | |
|---|---|---|
| 2013/0214296 A1 | 8/2013 | Mohammed et al. |
| 2016/0014878 A1* | 1/2016 | Kilhenny .............. H01L 23/142 |
| | | 438/26 |
| 2018/0190635 A1 | 7/2018 | Choi et al. |
| 2020/0235082 A1 | 7/2020 | Eid et al. |
| 2020/0275557 A1* | 8/2020 | Wu ...................... H05K 3/4608 |
| 2021/0127500 A1* | 4/2021 | Wu ...................... H05K 1/0298 |
| 2023/0094979 A1* | 3/2023 | Aleksov ............ H01L 23/53266 |
| | | 257/751 |
| 2023/0095063 A1* | 3/2023 | Choi .................... H01L 23/645 |
| | | 323/282 |

OTHER PUBLICATIONS

EPO; Extended European Search Report issued in EP Patent Application No. 22197145.0, dated Feb. 6, 2023; 10 pages.

* cited by examiner

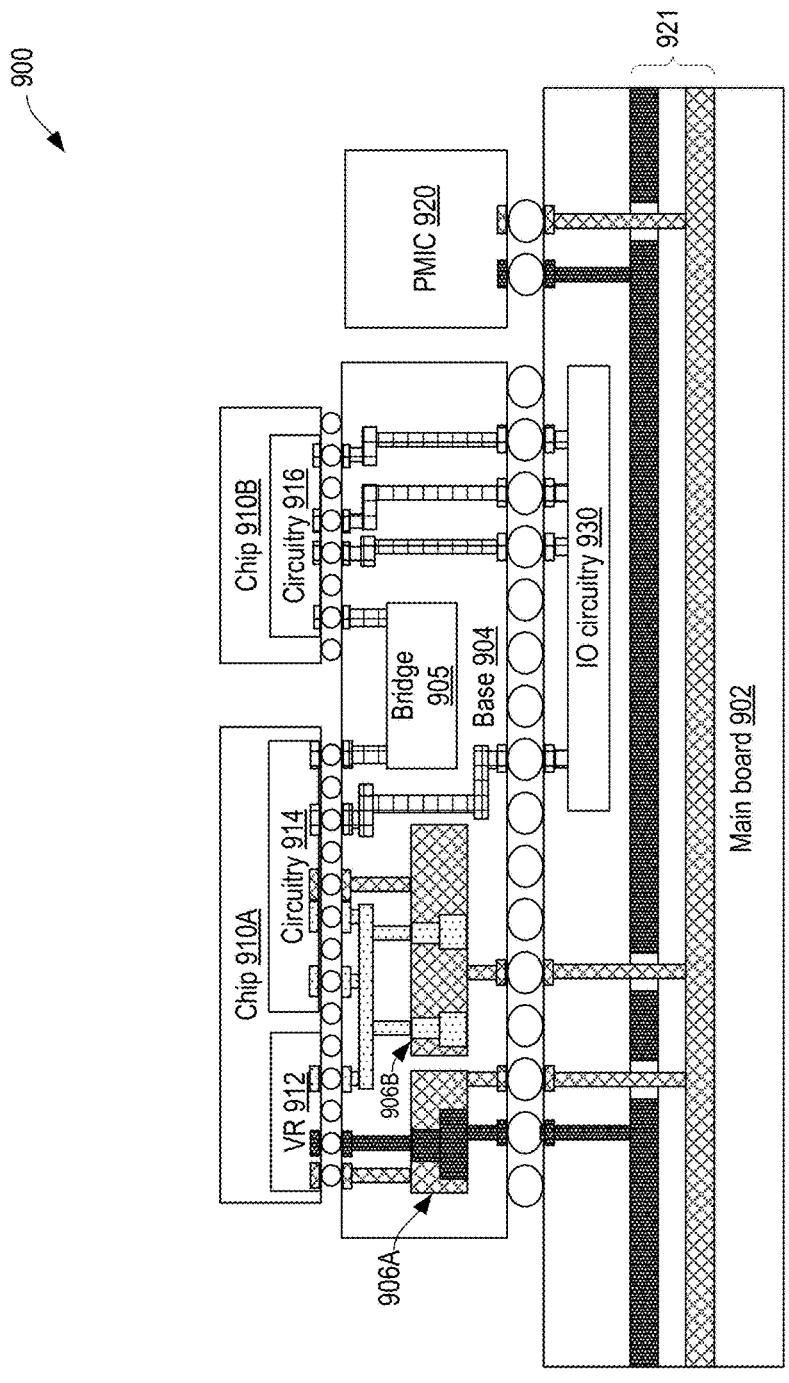
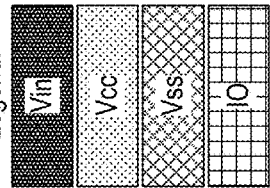
FIG. 9

CONFORMAL POWER DELIVERY STRUCTURE FOR DIRECT CHIP ATTACH ARCHITECTURES

BACKGROUND

In current DCA architectures, a base die may include multiple redistribution layers (RDL) that can be used for fan-out routing to map from a finer pitch between the top of the base die and the coarser pitch on the bottom of the base die. These RDL layers may be used for power delivery routing, however, this can cause one or more issues. For example, in some instances, most of the RDL routing may be used for power delivery, leaving few traces left for JO or other types of routing. Further, the IR drop in the RDL layers may be quite high when compared with traditional power plane structures.

BRIEF DESCRIPTION OF THE DRAWINGS

FIGS. 8-11 illustrate example systems with a base die architecture having a conformal power delivery structure in accordance with embodiments of the present disclosure.

DETAILED DESCRIPTION

Figure 1:
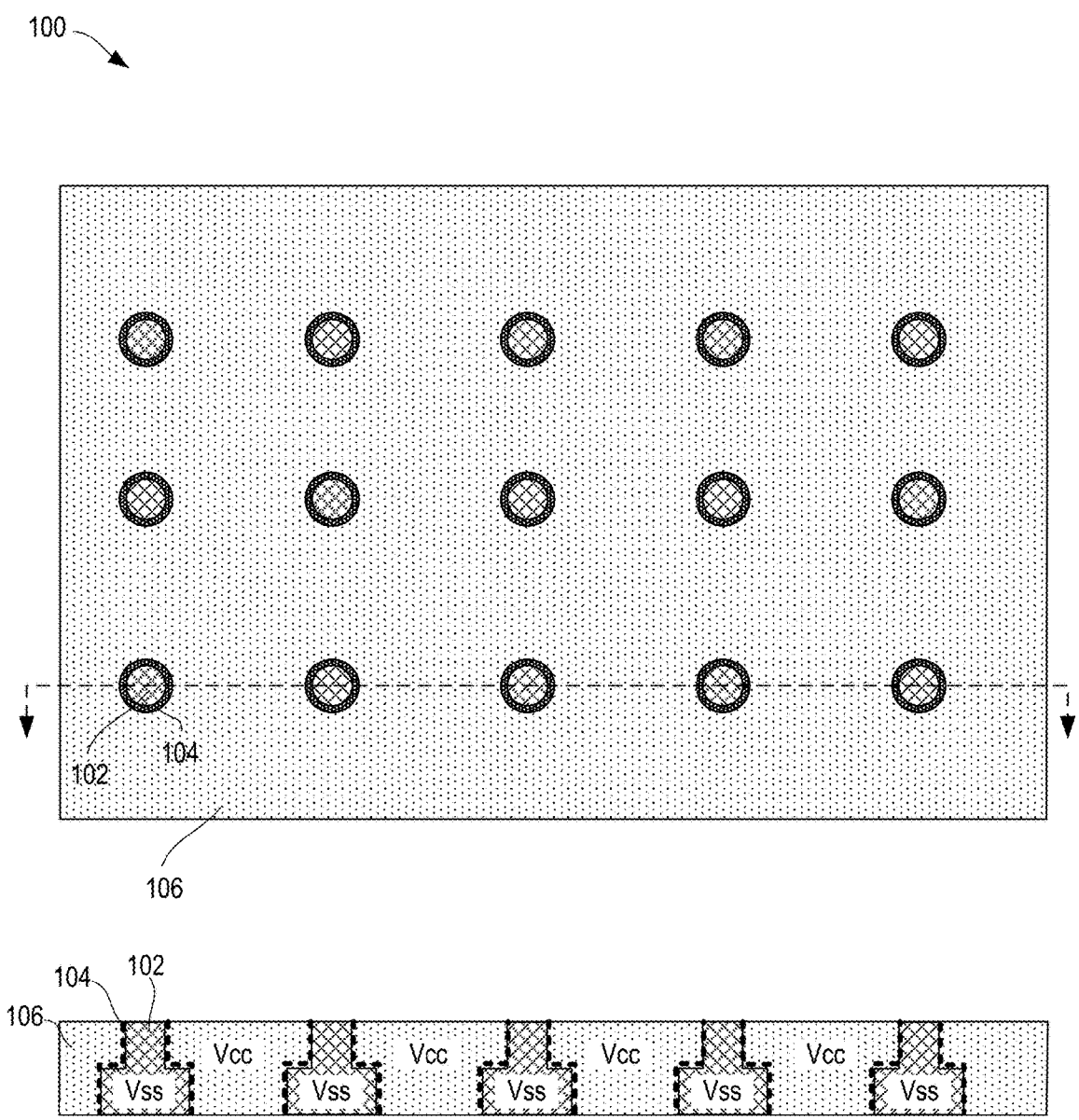
FIG. 1 illustrates an example conformal power delivery structure in accordance with embodiments of the present disclosure.

Aspects of the present disclosure may incorporate conformal power delivery structures into a base die (e.g., for a direct chip attach (DCA) architecture wherein the base die is directly attached to the main board). The conformal power delivery structure may provide a DC current path that is similar to that of a traditional power plane in a package substrate.

In current DCA architectures, the base die may include multiple redistribution layers (RDL) that can be used for fan-out routing to map from a finer pitch between the top of the base die and the coarser pitch on the bottom of the base die. For low power products this fan-out routing can, for example, be used to create a product that does not need a traditional package substrate and can be BGA-mounted (e.g., at ~210 um pitch) directly to a mainboard. This results in an extremely low Z-height for the assembled unit (e.g., ~0.4 mm), and an X-Y footprint that is limited only by the BGA pitch the mainboard technology can support. Higher power products can use the same principle to fan out signals to a larger pitch for improving yield and reliability performance, or to save money on substrate technology.

One potential issue with this approach is that the RDL layers are typically formed with backend fabrication equipment and are between ~1 um to 5 um thick, compared to ~15 um for a package layer. Further, there are generally only one to three RDL layers available. To maintain equivalent IR drop on the base die routing with a larger BGA pitch, a large amount of the RDL must be dedicated to power delivery traces. Moreover, IR drop may be worse than standard packaging. For instance, under typical routing conditions and metal density rules, such a configuration could result in an effective resistance of 30 mΩ/sq (uniaxial) or more, which is up to 10× higher than what might be achieved with traditional package power plane structures.

Dedicating so much of the RDL to power delivery of the high current rail can lead to a second potential issue, which is that low-current supplies, used to improve the lower power efficiency of mobile parts, are left with almost no metal for routing, and also lose many of the die bumps due versus a die at standard pitch. The combination of these two effects makes power delivery a major problem for these fanout strategies.

A separate challenge specific to DCA architectures is that there is no low-resistance shorting structure like the thick core copper planes of a conventional power plane structure in a package, and accordingly, the IR drop of the individual pins can be substantial if they are not effectively ganged in parallel, and can become a part of the net DC IR gradient the part is exposed to. This may cause issues with speed and power binning, because the gradient will be significantly worse than that of the platform, which does not have these pins in the power delivery path.

Through the inclusion of conformal power delivery structures as described herein, which may have a bi-directional resistance of 5 mΩ, making the IR drop of the DCA architecture comparable to a traditional package power plane solution. Fine pitch RDL layers may be implemented above or below the conformal power delivery structure, and a larger portion of these lines may now be used to route low current supplies, significantly reducing the IR drop they experience when compared with the scenarios above. In other areas of the base die, for instance, these RDL layers can be used to fan out input/output (JO) signals or for die-to-die connections. And in areas of the base complex where the IO density is higher and the high current power rails are not present, conventional pillars can be used.

FIG. 1 illustrates an example conformal power delivery structure 100 in accordance with embodiments of the present disclosure. In particular, FIG. 1 illustrates a top view of the conformal power delivery structure 100 and a side/cross-sectional view of the conformal power delivery structure 100. The conformal power delivery structure 100 includes a first power plane 102 and second power plane 106 formed on the first power plane 102, e.g., as described above. The power planes 102, 106 are separated by a thin dielectric material layer 104. As may be seen form the top view of the conformal power delivery structure 100, the size of the anti-pad created by the thin dielectric layer 104 may be quite smaller than the anti-pads required by traditional parallel power plane structures, e.g., an order(s) of magnitude smaller, potentially providing one or more advantages, such as better electrical performance, better lateral electrical resistance, and/or improved lateral inductance.

Figure 4:
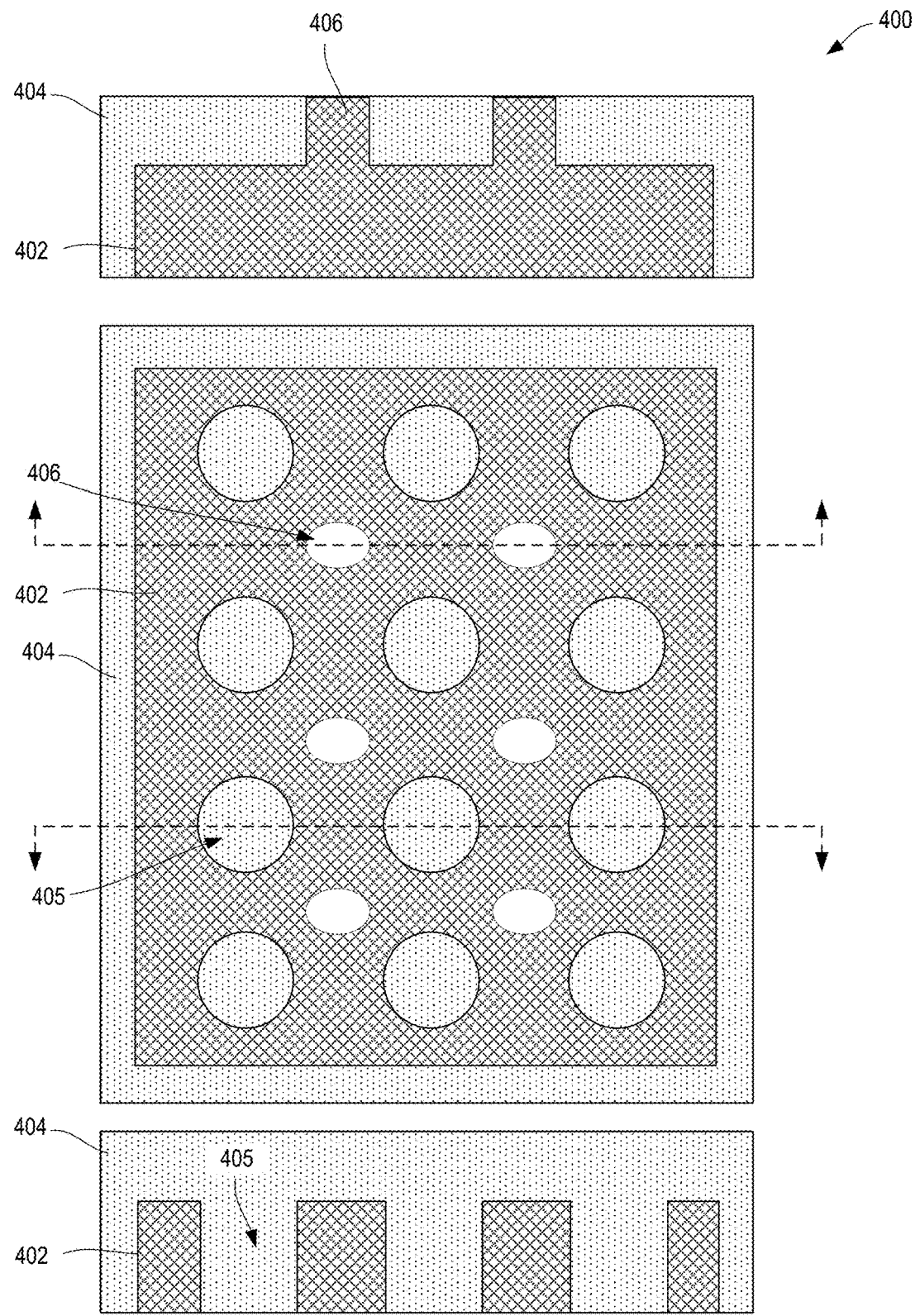
FIG. 4 illustrates a top view and two cross-sectional views of an example conformal power delivery structure with one bottom power plane.

Although sometimes described herein as being power "planes", it will be understood that the power planes of the present disclosure may not be planar in the geometric sense (e.g., completely flat in one plane like traditional power planes). In addition, although shown as formed in a particular way (e.g., with two power planes), the conformal power delivery structure 100 may be formed in any suitable manner (e.g., with three or more power planes, or with different via shapes, or no vias, or with different structures). As one example, the conformal power delivery structure 100 may be used to distribute power on the backside of a die, or a die stack as shown in FIG. 4.

As used herein, a first surface generally conforming to a second surface may refer to the first surface having the same or very similar shape as the first surface, with the first surface following along the surface of the second surface. For instance, in the example shown in FIG. 1, the lower surface of the plane 106 (the surface facing the plane 102) has the same shape as the upper surface of the plane 102 (the surface facing the plane 106). Thus, the dielectric layer 104 between the planes 102, 106 has the same shape as the upper surface of plane 102 and lower surface of plane 106. However, in some embodiments, due to manufacturing differences, tolerances, dielectric (or other layer) deposition methods, the conforming surfaces may not have the exact same shape as one another, but they may still be considered to be conforming in the sense that the lower surface of the upper plane 106 generally follows along with the surface of the upper surface of the lower plane 102 (and/or the dielectric layer 104 to the extent it's shape is slightly different from that of the upper surface of the plane 102).

As used herein, the terms "upper"/"lower" or "above"/ "below" may refer to relative locations of an object (e.g., the surfaces described above), especially in light of examples shown in the attached figures, rather than an absolute location of an object. For example, an upper surface of an apparatus may be on an opposite side of the apparatus from a lower surface of the object, and the upper surface may be facing upward generally only when viewed in a particular way. As another example, a first object above a second object may be on or near an "upper" surface of the second object rather than near a "lower" surface of the object, and the first object may be truly above the second object only when the two objects are viewed in a particular way.

Figure 2:
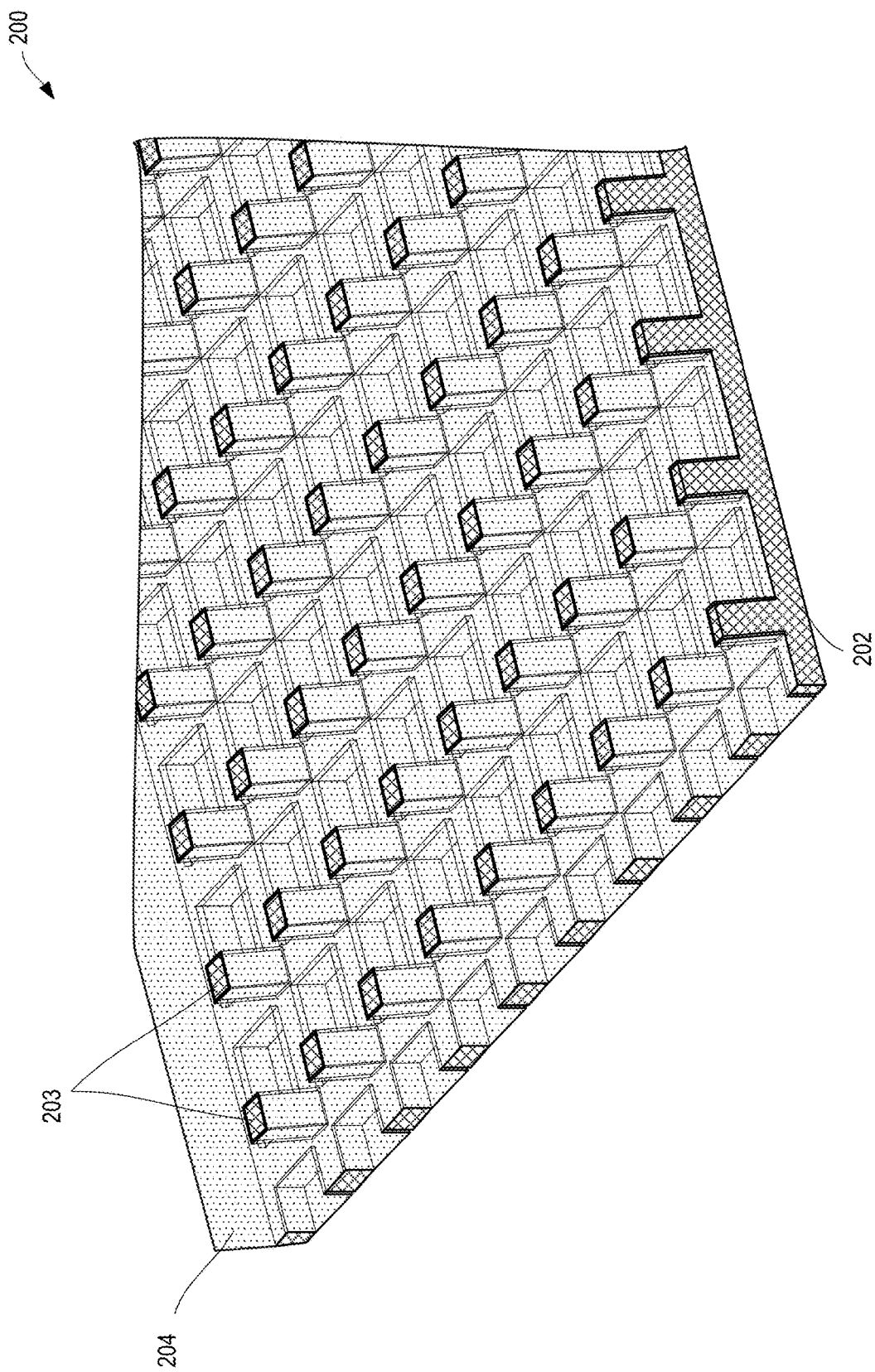
FIGS. 2 and 3 illustrate perspective views of example conformal power delivery structures in accordance with embodiments of the present disclosure.
Figure 3:
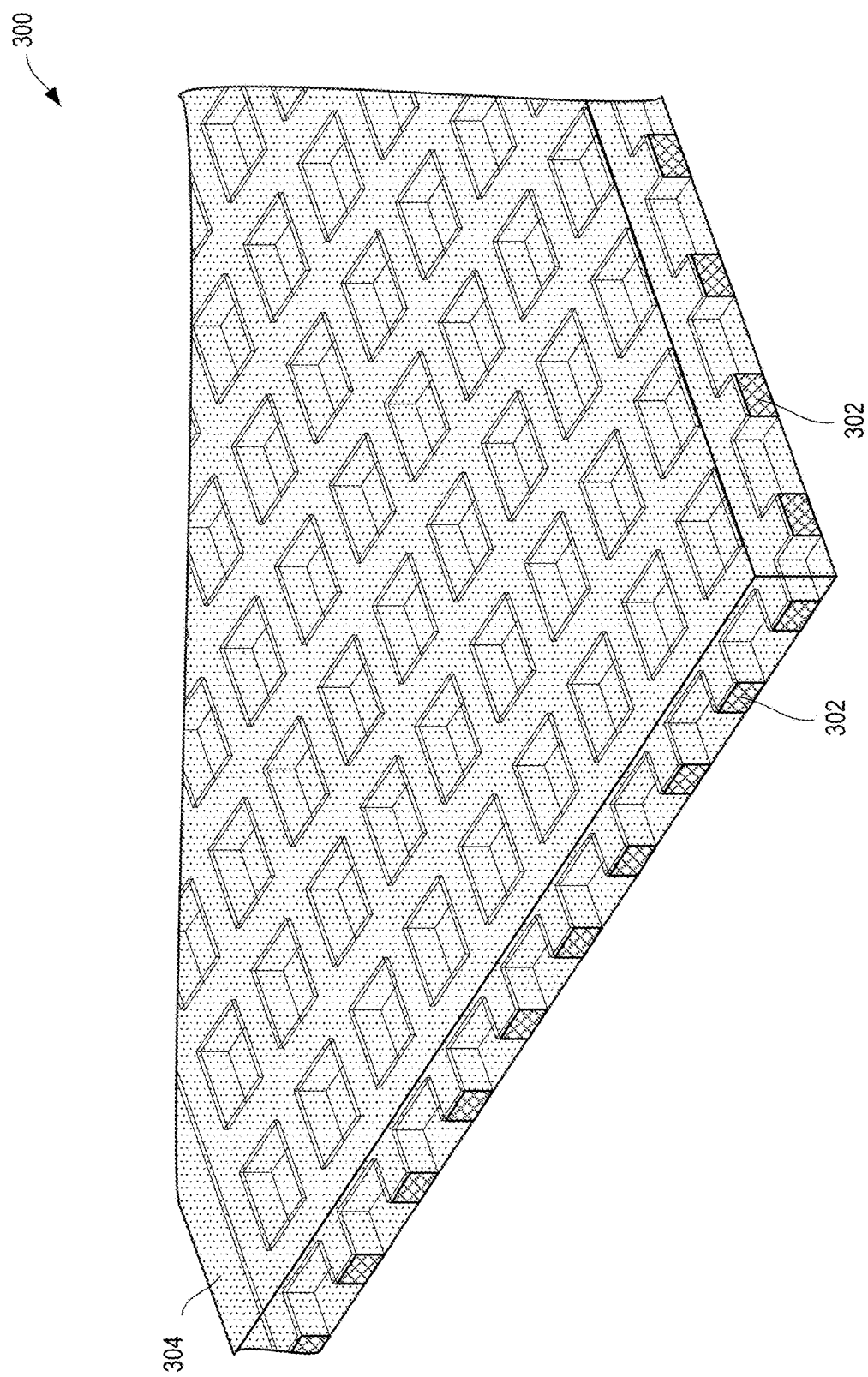

FIGS. 2 and 3 illustrate perspective views of example conformal power delivery structures in accordance with embodiments of the present disclosure. In the example shown in FIG. 2, the conformal power delivery structure 200 includes a bottom power plane 202 and top power plane 206 separated by a dielectric layer. The conformal power delivery structure 200 also includes a number of protrusions/ through connections 203 to allow the bottom power plane 202 to connect to a device that may be placed on the top surface of the top power plane 204 (e.g., a die, package substrate, or any other suitable connecting device or apparatus). In the example shown in FIG. 3, the conformal power delivery structure 300 includes a bottom power plane 302 and top power plane 306 separated by a dielectric layer. However, in the example shown in FIG. 3, there are no through connections going from the bottom power plane 302 to the top surface of the top power plane 304 as in FIG. 2.

Figure 7:
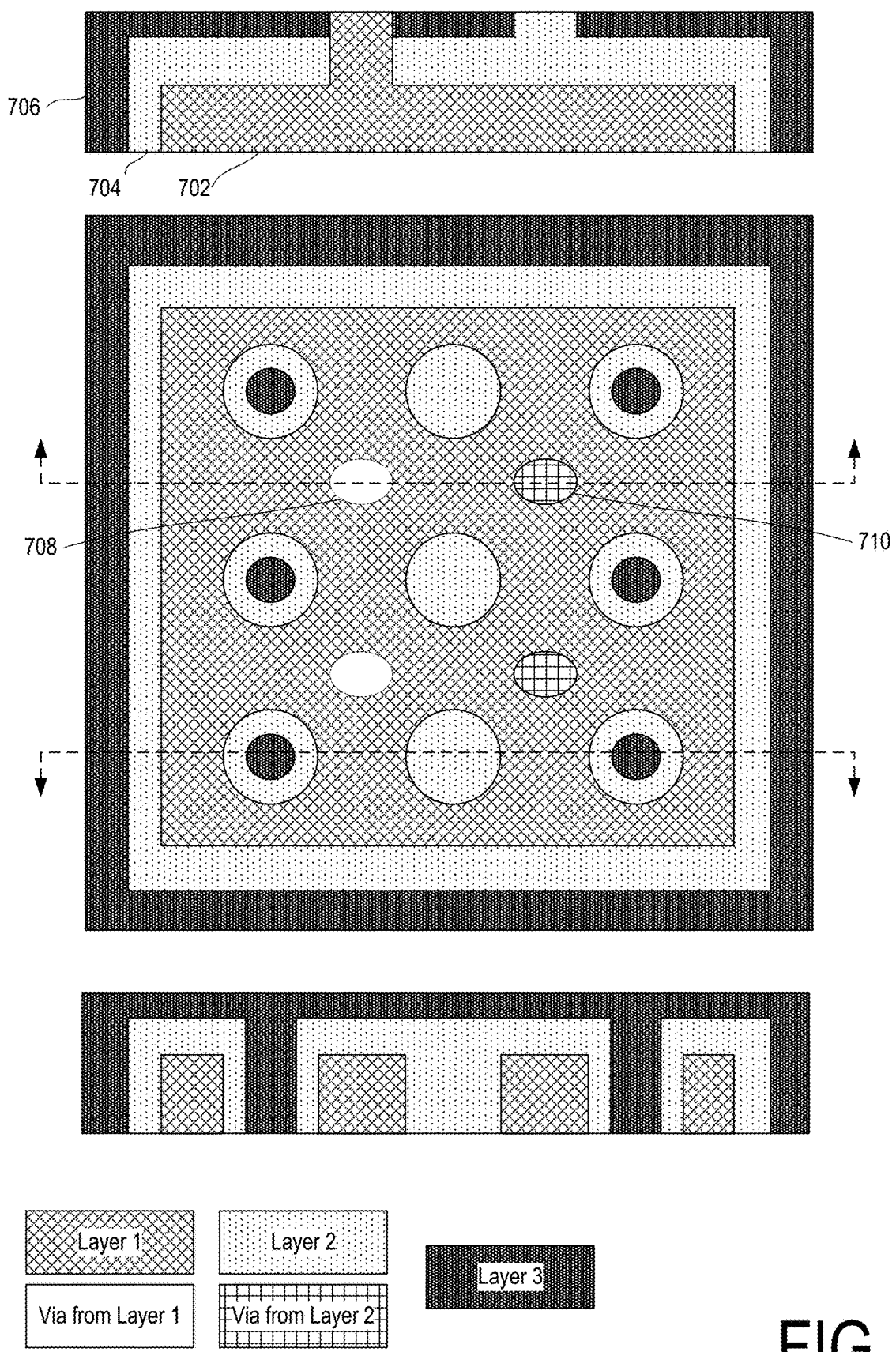
FIG. 7 illustrates a top view and two cross-sectional views of an example conformal power delivery structure with three power planes.
Figure 8:
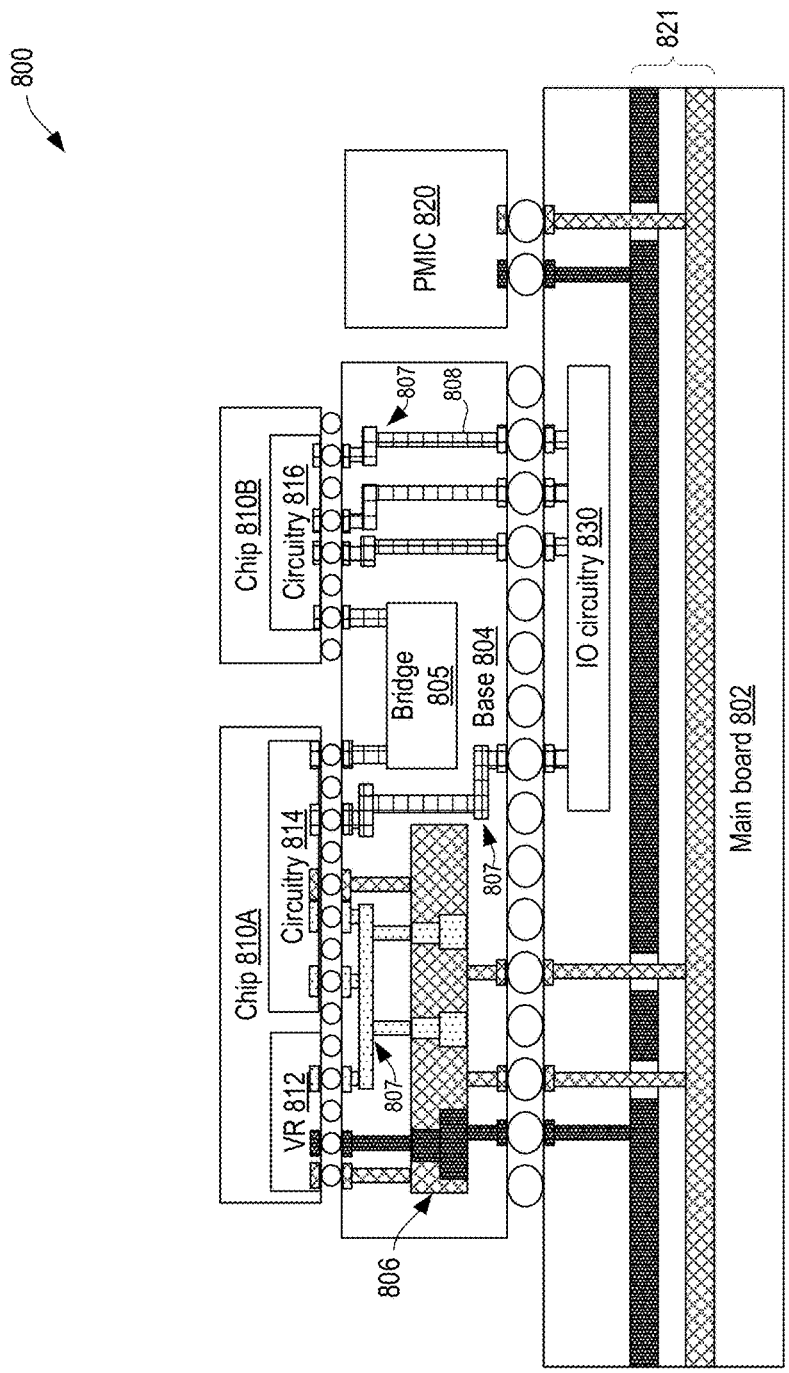

In the examples shown in FIGS. 2-3, the power planes form rectangular shapes which conform with one another. That is, the bottom power planes 202, 302 are formed with rectangular etched areas (and protrusions 203) in which the top power planes 204, 304 are formed. However, the etched areas and/or protrusions may be formed with other shapes. FIGS. 7-8 illustrate other examples shapes for such areas of a conformal power delivery structure.

FIG. 4 illustrates a top view and two cross-sectional views of an example conformal power delivery structure 400 with one bottom power plane. As shown in FIG. 4, the conformal power delivery structure 400 includes a bottom power plane layer 402 and a top power plane layer 404 formed over the bottom power plane layer 402. The conformal power delivery structure 400 also includes vias (e.g., 406) from the bottom power plane layer 402 through the top power plane layer 404, allowing the bottom power plane layer 402 to be accessed by a device or other structure positioned above the top power plane layer 404. In the example shown in FIG. 4, etched areas (e.g., 405) form holes in the bottom power plane layer 402 that allow the top power plane layer 404 to be accessed by a device or other structure positioned below the conformal power delivery structure 400. Although the etched areas and vias are formed in particular shapes in the example shown, the etched areas and/or vias may be formed in any other suitable shape.

Figure 5:
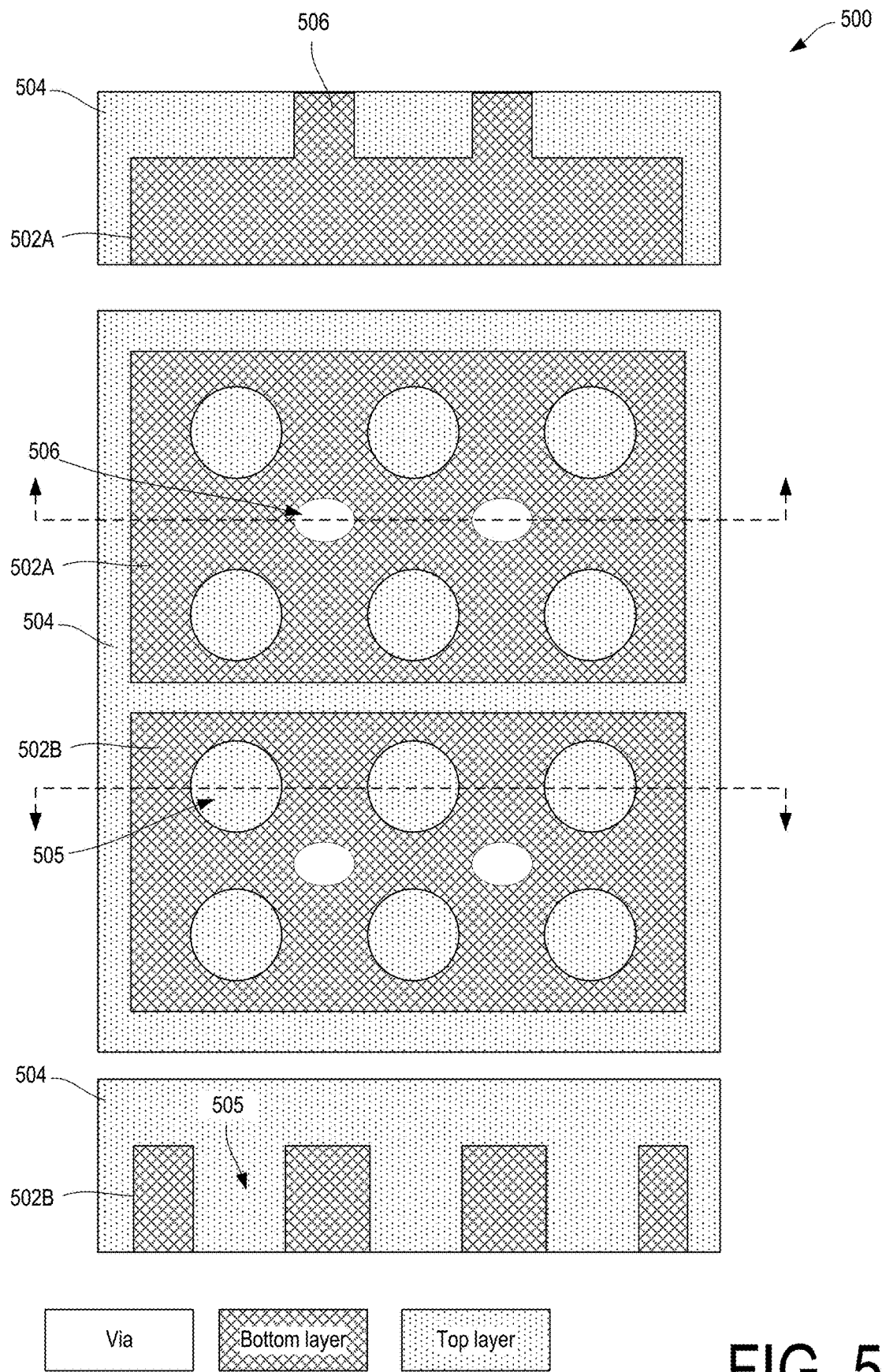
FIG. 5 illustrates a top view and two cross-sectional views of an example conformal power delivery structure with two bottom power planes.

FIG. 5 illustrates a top view and two cross-sectional views of an example conformal power delivery structure 500 with two bottom power planes. In particular, the example power delivery structure is the same as the structure 400 of FIG. 4, but with the bottom power plane layer 402 being split into two separate power planes 402A, 402B, which may allow for more than two power planes in the structure 400 (e.g., as described below).

Figure 6A:
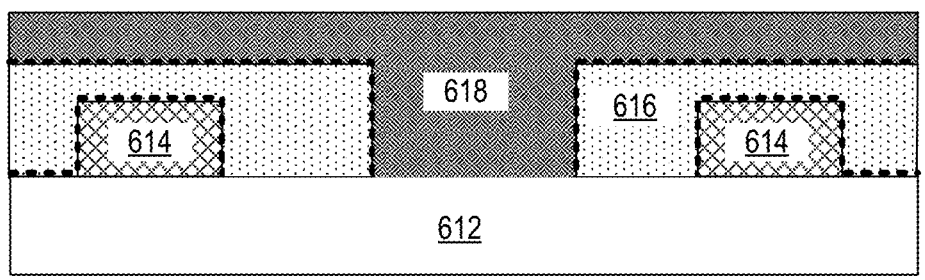
FIGS. 6A-6B illustrate example three-layer conformal power delivery structures.
Figure 6B:
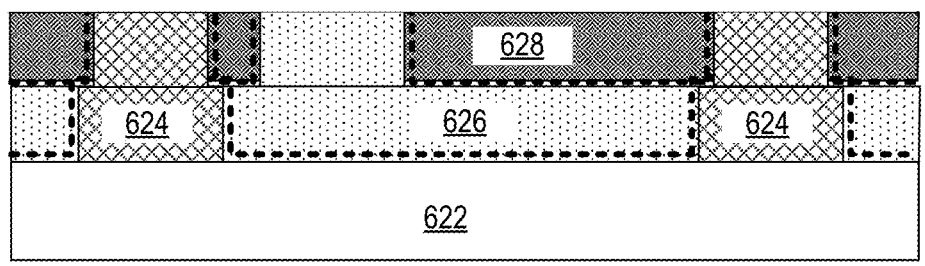

In some instances, rather than splitting the bottom power plane into two as shown in FIG. 5, a conformal power delivery structure may be made with three power plane layers. FIGS. 6A-6B illustrate example three-layer conformal power delivery structures 610, 620. In each of the conformal power delivery structures shown, there is a first layer (614, 624) formed on a substrate (612, 622), a second layer (616, 626) that conforms with the first layer (614, 624), and a third layer (618, 628) that conforms with the second layer (616, 626), with a dielectric material between each adjacent layer. Though not shown, the substrates 612, 622 may include one or more connections (e.g., pads, lines, etc.) to connect to each of the power planes of the conformal power delivery structure. In the example shown in FIG. 6A, the conformal power delivery structure 610 provides access to all three power planes at the bottom side of the structure, i.e., at the substrate 612. In contrast, in the example shown in FIG. 6B, the conformal power delivery structure 620 provides access to all three power planes at the top side of the structure, i.e., on the opposite side of the substrate 622.

FIG. 7 illustrates a top view and two cross-sectional views of an example conformal power delivery structure 700 with three power planes. As shown in FIG. 7, the conformal power delivery structure 700 includes a first power plane layer 702, second power plane layer 704 formed over the first power plane layer 702, and a third power plane layer 706 formed over the second power plane layer 704. The conformal power delivery structure 700 also includes vias (e.g., 708) from the first power plane layer 702 through the second power plane layer 704 and third power plane layer 706 and vias (e.g., 710) from the second power plane layer 714 through the third power plane layer 704, allowing the power plane layers 702, 704 to be accessed by a device or other structure positioned above the third power plane layer 706. In the example shown in FIG. 7, etched areas form holes in the bottom power plane layers to allow the top power plane layers to be accessed by a device or other structure positioned below the conformal power delivery structure 700, similar to the structures described above.

Figure 10:
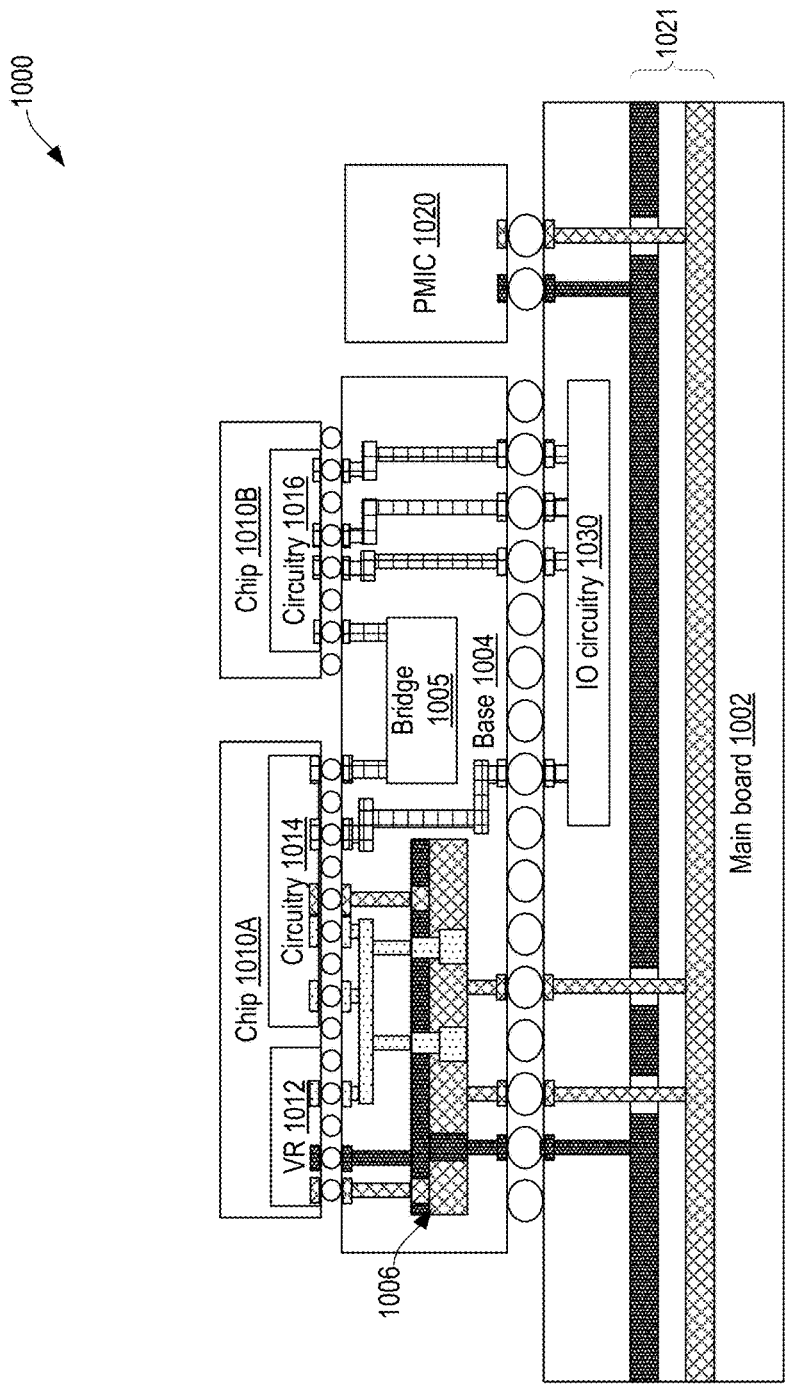
Figure 11:
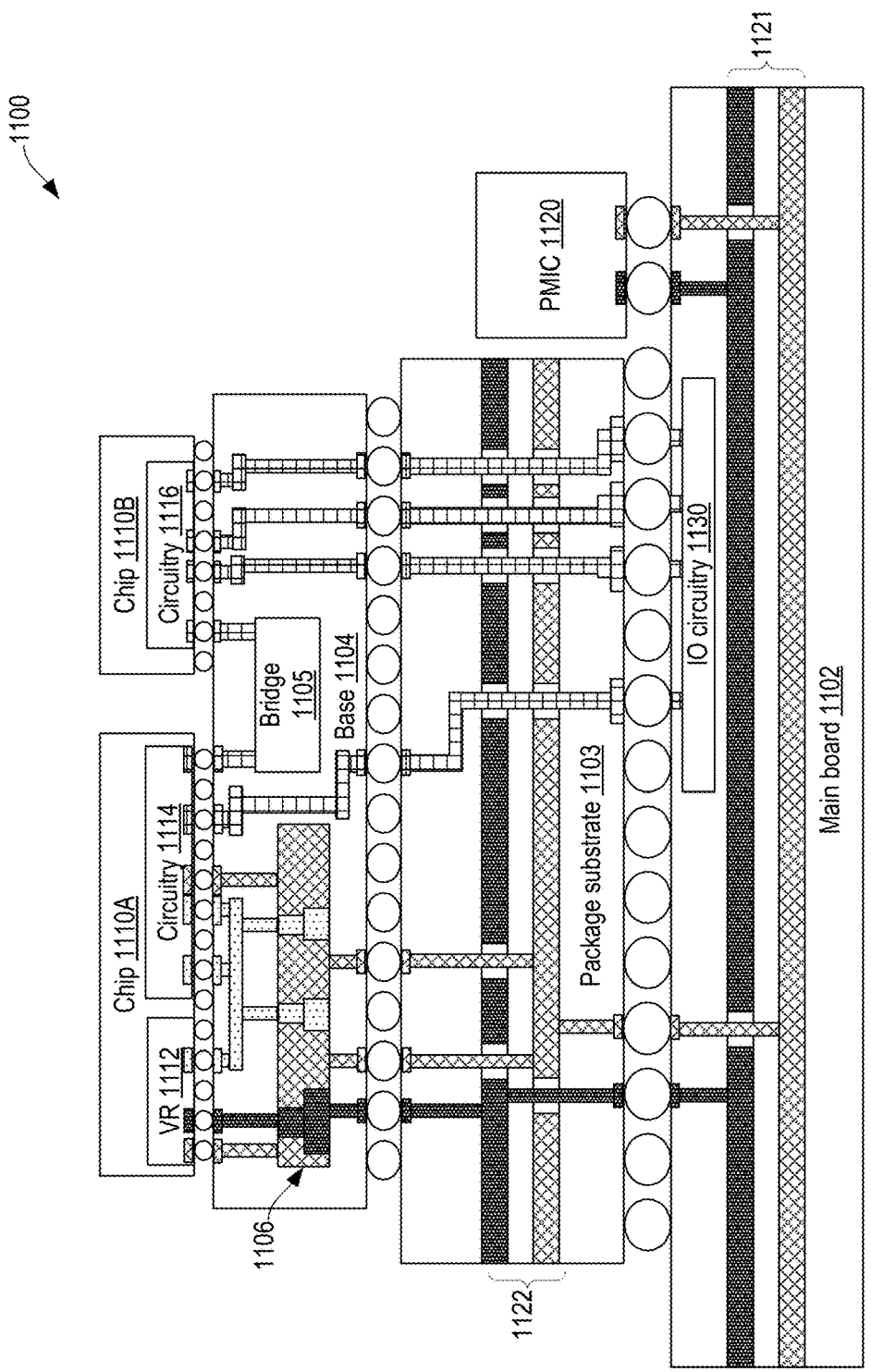

FIGS. 8-11 illustrate example systems with a base die architecture having a conformal power delivery structure in accordance with embodiments of the present disclosure. In particular, FIGS. 8-10 illustrate example systems with direct chip attach architectures where the base die is attached directly to a main board, while FIG. 11 illustrates an example system where the base die is attached to a package substrate, which is in turn attached to the main board. In the examples shown in FIGS. 8-10, the connection pad/ball pitch between the main board (e.g., 802) and the base die (e.g., 804) may be approximately 150-250 um and the connection pad/ball pitch between the base die and the chips on the base die may be approximately 10-150 um. As used herein, the pitch of connection pads may refer to the distance between the middles of the pads, in certain instances. In the example shown in FIG. 11, the ball pitch between the main board 1102 and the package substrate 1103 may be approximately 300-400 um, while the other ball pitches may be the same as in FIGS. 8-11. Typically, the ball pitch between the package substrate and the main board is smaller (e.g., between 80-130 um); however, the chip-on-base architecture shown here may allow for large ball pitch between the package substrate and base die, which may allow for a package substrate that is not as expensive to manufacture.

Referring to FIG. 8, the example system 800 includes a main board 802 (e.g., a motherboard) with a base die 804 and a power management integrated circuit (PMIC) 820 attached thereto. The PMIC 820 includes circuitry to receive input power, e.g., from a battery source, and distribute the power to components connected to the main board 802. For instance, the PMIC 820 may include one or more DC/DC converters, regulators, etc. In some instances, the voltage provided as output by the PMIC 820 may be approximately 5V. The PMIC 820 provides its output voltage (referred to as "Vin" in the examples shown) to a power plane 821 within the main board 802. The power plane 821 may be a parallel power plane as shown, or may be implemented as a conformal power delivery structure similar to the structures described above.

The Vin voltage is then provided to the conformal power delivery structure 806 within the base die 804, and then from the conformal power delivery structure 806 to the voltage regulator (VR) 812 within the chip 810A. The VR 812 may be a low drop out (LDO) linear regulator or a switching regulator, in certain embodiments. The VR 812 may convert the Vin voltage to another voltage (Vss in the examples shown, e.g., ~1.0-1.2V), which is provided back to the conformal power delivery structure 806 for distribution. For instance, in the example shown, the Vss voltage is provided to the circuitry 814 within the chip 810A. Although not shown, in some embodiments, the Vss voltage may be provided to other circuitries of the chip 810A, to other chips (e.g., circuitry 816 of chip 810B) or to other components within or attached to the base die 804 that are not shown. Further, although shown as being located in the chip 810A, some embodiments may implement the VR 812 in another location, e.g., inside the main board 802 or the base die 804.

As shown, the conformal power delivery structure 806 includes two separated bottom layers, one that handles the Vin power plane and another than handles the Vss power plane, and the top layer of the conformal power delivery structure 806 handles the Vcc power plane as shown. The conformal power delivery structure 806 may be implemented in a similar manner to the conformal power delivery structure shown in FIG. 5.

In the example shown, the base die 804 includes RDL layers 807. As used herein, an RDL layer may refer to a conductive layer (e.g., metal) on a die (e.g., in the base die 804) that makes the connection pads of the die available in other locations of the die, e.g., to distribute the signal of the pad to another location or for better access to the pad where necessary. For instance, in the example shown, certain of the RDL layers 807 pass the Vss voltage between the conformal power delivery structure 806 and components of the chip 810A. These RDL layers may be used to fan out between a smaller pitch of the base-to-chip interface to a large pitch of the vias in the conformal power delivery structure 806 as shown. Other RDL layers are used to route IO lines (e.g., from the circuitry 814 around the conformal power delivery structure 806 and also to fan out to the larger pitch at the bottom of the base die 804 as shown). In other areas of the base die 804 (e.g., on the right side of the die 804 in FIG. 8), RDL layers 807 are used to map to the small die-to-chip 810B pitch to the IO pillars 808 (which may be metal, in certain embodiments). In the examples shown, the IO signals go through the base die 804 to IO circuitry 830 of the main board 802, which may route the signals to IO devices connected to the main board 802 (not shown).

The chips 810 of FIG. 8 may include one or more integrated circuits (e.g., circuitry 814) to implement certain functions, and may accordingly be referred to as integrated circuit dies or integrated circuit chips in certain instances. For instance, in certain embodiments, the chip 810A may be a central processing unit (CPU) with the circuitry 814 including one or more CPU cores, the chip 810B may be a graphics processing unit (GPU) with the circuitry 816 including one or more GPU cores. The base die 804 also includes bridge circuitry 805 that bridges communications between the chips 810A, 810B. For instance, the bridge circuitry may include a controller hub that bridges the communication between the CPU and GPU.

Referring now to FIG. 9, the example system 900 is implemented the same as the system 800 (i.e., includes the same components implemented in the same or similar manner etc.). That is, the main board 902 may be implemented in the same or similar manner as the main board 802, the base die 904 may be may be implemented in the same or similar manner as the base die 804, the bridge circuitry 905 may be implemented in the same or similar manner as the bridge circuitry 805, the chips 910 may be implemented in the same or similar manner as the chips 810, and the PMIC 920 may be implemented in the same or similar manner as the PMIC 820. However, in contrast with the system 800, the system 900 includes a base die 904 that includes two separate conformal power delivery structures 906A, 906B rather than one conformal power delivery structure 806 with multiple lower planes as shown in FIG. 8.

Referring now to FIG. 10, the example system 1000 is implemented the same as the system 800 (i.e., includes the same components implemented in the same or similar manner etc.). That is, the main board 1002 may be implemented in the same or similar manner as the main board 802, the base die 1004 may be may be implemented in the same or similar manner as the base die 804, the bridge circuitry 1005 may be implemented in the same or similar manner as the bridge circuitry 805, the chips 1010 may be implemented in the same or similar manner as the chips 810, and the PMIC 1020 may be implemented in the same or similar manner as the PMIC 820. However, in contrast with the system 800, the system 1000 includes a conformal power delivery structure 1006 with three layers rather than one conformal power delivery structure with multiple lower planes as shown in FIG. 8. For instance, the conformal power delivery structure 1006 may be implemented in a similar manner to the conformal power delivery structures shown in FIGS. 6-7.

Referring now to FIG. 11, the example system 1100 is implemented the same as the system 800 (i.e., includes the same components implemented in the same or similar manner etc.). That is, the main board 1102 may be implemented in the same or similar manner as the main board 802, the base die 1104 may be may be implemented in the same or similar manner as the base die 804, the bridge circuitry 1105 may be implemented in the same or similar manner as the bridge circuitry 805, the RDL layers 1107 may be implemented in the same or similar manner as the RDL layers 807, the chips 1110 may be implemented in the same or similar manner as the chips 810, and the PMIC 1120 may be implemented in the same or similar manner as the PMIC 820.

However, in contrast with the system 800, the base die 1104 of the system 1100 is on a package substrate 1103 instead of directly on the main board 1102. In the example shown, the package substrate 1103 includes a power plane structure 1122 that is similar to the power plane structure 1121 of the main board. The power plane structures 1121, 1122 may be parallel plane structures as shown, or in other embodiments, one or both may be implemented with conformal power delivery structures as described herein. The Vin voltage from the PMIC 1112 goes into the power plane structure 1121 as in the previous examples, and then passes through the power plane structure 1122 of the package substrate 1103, where it is then routed up into the conformal power delivery structure 1106 of the base die 1104.

Figure 12:
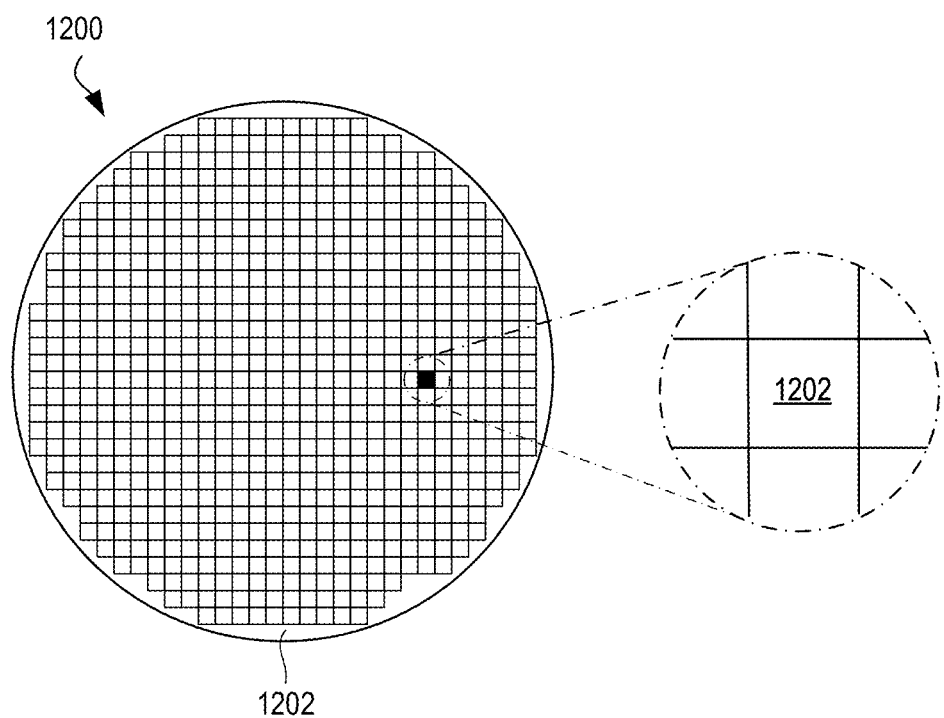
FIG. 12 is a top view of a wafer and dies that may be included in a microelectronic assembly, in accordance with any of the embodiments disclosed herein.

FIG. 12 is a top view of a wafer 1200 and dies 1202 that may include any of the architectures with conformal power delivery structures disclosed herein. The wafer 1200 may be composed of semiconductor material and may include one or more dies 1202 having integrated circuit structures formed on a surface of the wafer 1200. The individual dies 1202 may be a repeating unit of an integrated circuit product that includes any suitable integrated circuit. After the fabrication of the semiconductor product is complete, the wafer 1200 may undergo a singulation process in which the dies 1202 are separated from one another to provide discrete "chips" of the integrated circuit product. The die 1202 may include one or more transistors (e.g., some of the transistors 1340 of FIG. 13, discussed below), supporting circuitry to route electrical signals to the transistors, passive components (e.g., signal traces, resistors, capacitors, or inductors), and/or any other integrated circuit components. In some embodiments, the wafer 1200 or the die 1202 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1202. For example, a memory array formed by multiple memory devices may be formed on a same die 1202 as a processor unit (e.g., the processor unit 1502 of FIG. 15) or other logic that is configured to store information in the memory devices or execute instructions stored in the memory array.

Figure 13:
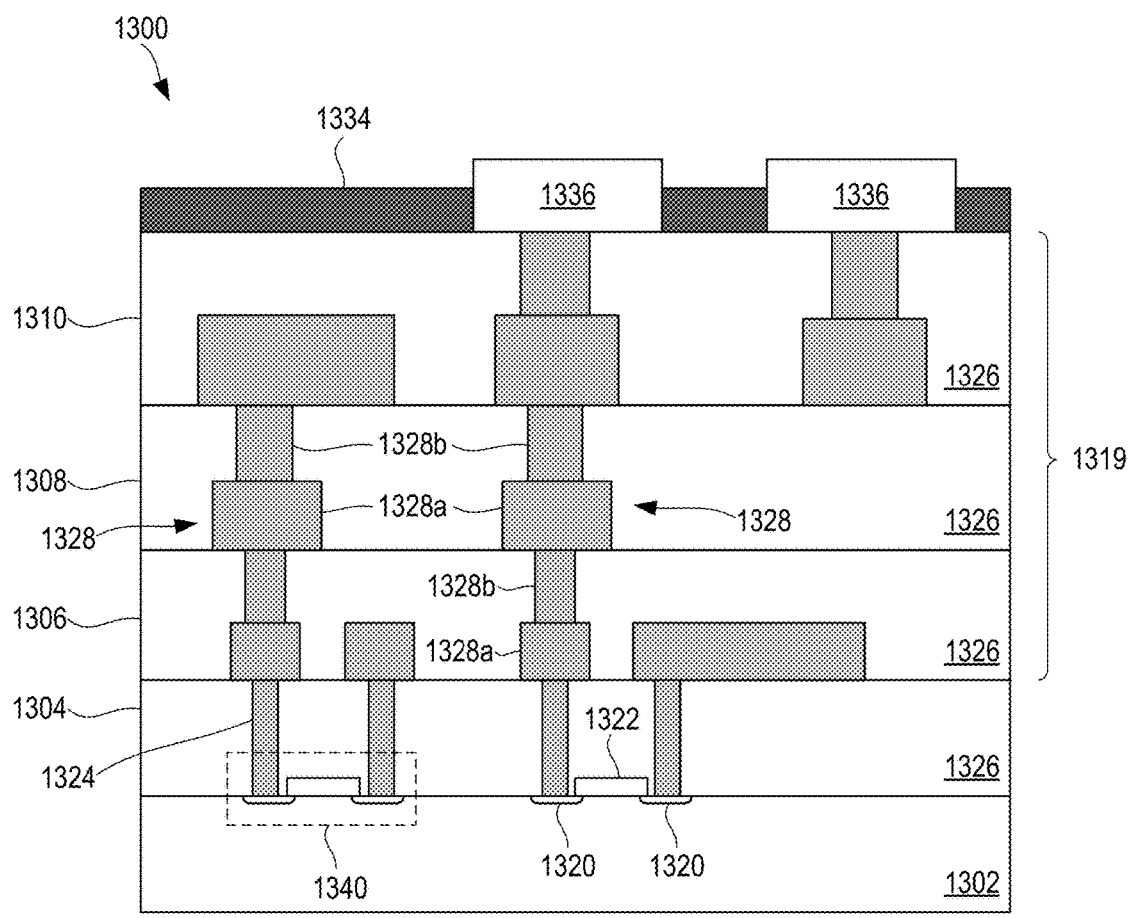
FIG. 13 is a cross-sectional side view of an integrated circuit device that may be included in a microelectronic assembly, in accordance with any of the embodiments disclosed herein.

FIG. 13 is a cross-sectional side view of an integrated circuit device 1300 that may include any of the architectures with conformal power delivery structures disclosed herein. One or more of the integrated circuit devices 1300 may be included in one or more dies 1202 (FIG. 12). The integrated circuit device 1300 may be formed on a die substrate 1302 (e.g., the wafer 1200 of FIG. 12) and may be included in a die (e.g., the die 1202 of FIG. 12). The die substrate 1302 may be a semiconductor substrate composed of semiconductor material systems including, for example, n-type or p-type materials systems (or a combination of both). The die substrate 1302 may include, for example, a crystalline substrate formed using a bulk silicon or a silicon-on-insulator (SOI) substructure. In some embodiments, the die substrate 1302 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 1302. Although a few examples of materials from which the die substrate 1302 may be formed are described here, any material that may serve as a foundation for an integrated circuit device 1300 may be used. The die substrate 1302 may be part of a singulated die (e.g., the dies 1202 of FIG. 12) or a wafer (e.g., the wafer 1200 of FIG. 12).

The integrated circuit device 1300 may include one or more device layers 1304 disposed on the die substrate 1302. The device layer 1304 may include features of one or more transistors 1340 (e.g., metal oxide semiconductor field-effect transistors (MOSFETs)) formed on the die substrate 1302. The transistors 1340 may include, for example, one or more source and/or drain (S/D) regions 1320, a gate 1322 to control current flow between the S/D regions 1320, and one or more S/D contacts 1324 to route electrical signals to/from the S/D regions 1320. The transistors 1340 may include additional features not depicted for the sake of clarity, such as device isolation regions, gate contacts, and the like. The transistors 1340 are not limited to the type and configuration depicted in FIG. 13 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

A transistor 1340 may include a gate 1322 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1340 along the source-channel-drain direction, the gate electrode may consist of a U-shaped structure that includes a bottom portion substantially parallel to the surface of the die substrate 1302 and two sidewall portions that are substantially perpendicular to the top surface of the die substrate 1302. In other embodiments, at least one of the metal layers that form the gate electrode may simply be a planar layer that is substantially parallel to the top surface of the die substrate 1302 and does not include sidewall portions substantially perpendicular to the top surface of the die substrate 1302. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1320 may be formed within the die substrate 1302 adjacent to the gate 1322 of individual transistors 1340. The S/D regions 1320 may be formed using an implantation/diffusion process or an etching/deposition process, for example. In the former process, dopants such as boron, aluminum, antimony, phosphorous, or arsenic may be ion-implanted into the die substrate 1302 to form the S/D regions 1320. An annealing process that activates the dopants and causes them to diffuse farther into the die substrate 1302 may follow the ion-implantation process. In the latter process, the die substrate 1302 may first be etched to form recesses at the locations of the S/D regions 1320. An epitaxial deposition process may then be carried out to fill the recesses with material that is used to fabricate the S/D regions 1320. In some implementations, the S/D regions 1320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1320 may be formed using one or more alternate semiconductor materials such as germanium or a group III-V material or alloy. In further embodiments, one or more layers of metal and/or metal alloys may be used to form the S/D regions 1320.

Electrical signals, such as power and/or input/output (I/O) signals, may be routed to and/or from the devices (e.g., transistors 1340) of the device layer 1304 through one or more interconnect layers disposed on the device layer 1304 (illustrated in FIG. 13 as interconnect layers 1306-1310). For example, electrically conductive features of the device layer 1304 (e.g., the gate 1322 and the S/D contacts 1324) may be electrically coupled with the interconnect structures 1328 of the interconnect layers 1306-1310. The one or more interconnect layers 1306-1310 may form a metallization stack (also referred to as an "ILD stack") 1319 of the integrated circuit device 1300.

The interconnect structures 1328 may be arranged within the interconnect layers 1306-1310 to route electrical signals according to a wide variety of designs; in particular, the arrangement is not limited to the particular configuration of interconnect structures 1328 depicted in FIG. 13. Although a particular number of interconnect layers 1306-1310 is depicted in FIG. 13, embodiments of the present disclosure include integrated circuit devices having more or fewer interconnect layers than depicted.

In some embodiments, the interconnect structures 1328 may include lines 1328*a* and/or vias 1328*b* filled with an electrically conductive material such as a metal. The lines 1328*a* may be arranged to route electrical signals in a direction of a plane that is substantially parallel with a surface of the die substrate 1302 upon which the device layer 1304 is formed. For example, the lines 1328*a* may route electrical signals in a direction in and out of the page and/or in a direction across the page from the perspective of FIG. 13. The vias 1328*b* may be arranged to route electrical signals in a direction of a plane that is substantially perpendicular to the surface of the die substrate 1302 upon which the device layer 1304 is formed. In some embodiments, the vias 1328*b* may electrically couple lines 1328*a* of different interconnect layers 1306-1310 together.

The interconnect layers 1306-1310 may include a dielectric material 1326 disposed between the interconnect structures 1328, as shown in FIG. 13. In some embodiments, dielectric material 1326 disposed between the interconnect structures 1328 in different ones of the interconnect layers 1306-1310 may have different compositions; in other embodiments, the composition of the dielectric material 1326 between different interconnect layers 1306-1310 may be the same. The device layer 1304 may include a dielectric material 1326 disposed between the transistors 1340 and a bottom layer of the metallization stack as well. The dielectric material 1326 included in the device layer 1304 may have a different composition than the dielectric material 1326 included in the interconnect layers 1306-1310; in other embodiments, the composition of the dielectric material 1326 in the device layer 1304 may be the same as a dielectric material 1326 included in any one of the interconnect layers 1306-1310.

A first interconnect layer 1306 (referred to as Metal 1 or "M1") may be formed directly on the device layer 1304. In some embodiments, the first interconnect layer 1306 may include lines 1328*a* and/or vias 1328*b*, as shown. The lines 1328*a* of the first interconnect layer 1306 may be coupled with contacts (e.g., the S/D contacts 1324) of the device layer 1304. The vias 1328*b* of the first interconnect layer 1306 may be coupled with the lines 1328*a* of a second interconnect layer 1308.

The second interconnect layer 1308 (referred to as Metal 2 or "M2") may be formed directly on the first interconnect layer 1306. In some embodiments, the second interconnect layer 1308 may include via 1328*b* to couple the lines 1328 of the second interconnect layer 1308 with the lines 1328*a* of a third interconnect layer 1310. Although the lines 1328*a* and the vias 1328*b* are structurally delineated with a line within individual interconnect layers for the sake of clarity, the lines 1328*a* and the vias 1328*b* may be structurally and/or materially contiguous (e.g., simultaneously filled during a dual-damascene process) in some embodiments.

The third interconnect layer 1310 (referred to as Metal 3 or "M3") (and additional interconnect layers, as desired) may be formed in succession on the second interconnect layer 1308 according to similar techniques and configurations described in connection with the second interconnect layer 1308 or the first interconnect layer 1306. In some embodiments, the interconnect layers that are "higher up" in the metallization stack 1319 in the integrated circuit device 1300 (i.e., farther away from the device layer 1304) may be thicker that the interconnect layers that are lower in the metallization stack 1319, with lines 1328*a* and vias 1328*b* in the higher interconnect layers being thicker than those in the lower interconnect layers.

The integrated circuit device 1300 may include a solder resist material 1334 (e.g., polyimide or similar material) and one or more conductive contacts 1336 formed on the interconnect layers 1306-1310. In FIG. 13, the conductive contacts 1336 are illustrated as taking the form of bond pads. The conductive contacts 1336 may be electrically coupled with the interconnect structures 1328 and configured to route the electrical signals of the transistor(s) 1340 to external devices. For example, solder bonds may be formed on the one or more conductive contacts 1336 to mechanically and/or electrically couple an integrated circuit die including the integrated circuit device 1300 with another component (e.g., a printed circuit board). The integrated circuit device 1300 may include additional or alternate structures to route the electrical signals from the interconnect layers 1306-1310; for example, the conductive contacts 1336 may include other analogous features (e.g., posts) that route the electrical signals to external components.

In some embodiments in which the integrated circuit device 1300 is a double-sided die, the integrated circuit device 1300 may include another metallization stack (not shown) on the opposite side of the device layer(s) 1304. This metallization stack may include multiple interconnect layers as discussed above with reference to the interconnect layers 1306-1310, to provide conductive pathways (e.g., including conductive lines and vias) between the device layer(s) 1304 and additional conductive contacts (not shown) on the opposite side of the integrated circuit device 1300 from the conductive contacts 1336.

In other embodiments in which the integrated circuit device 1300 is a double-sided die, the integrated circuit device 1300 may include one or more through silicon vias (TSVs) through the die substrate 1302; these TSVs may make contact with the device layer(s) 1304, and may provide conductive pathways between the device layer(s) 1304 and additional conductive contacts (not shown) on the opposite side of the integrated circuit device 1300 from the conductive contacts 1336. In some embodiments, TSVs extending through the substrate can be used for routing power and ground signals from conductive contacts on the opposite side of the integrated circuit device 1300 from the conductive contacts 1336 to the transistors 1340 and any other components integrated into the die 1300, and the metallization stack 1319 can be used to route I/O signals from the conductive contacts 1336 to transistors 1340 and any other components integrated into the die 1300.

Multiple integrated circuit devices 1300 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 14:
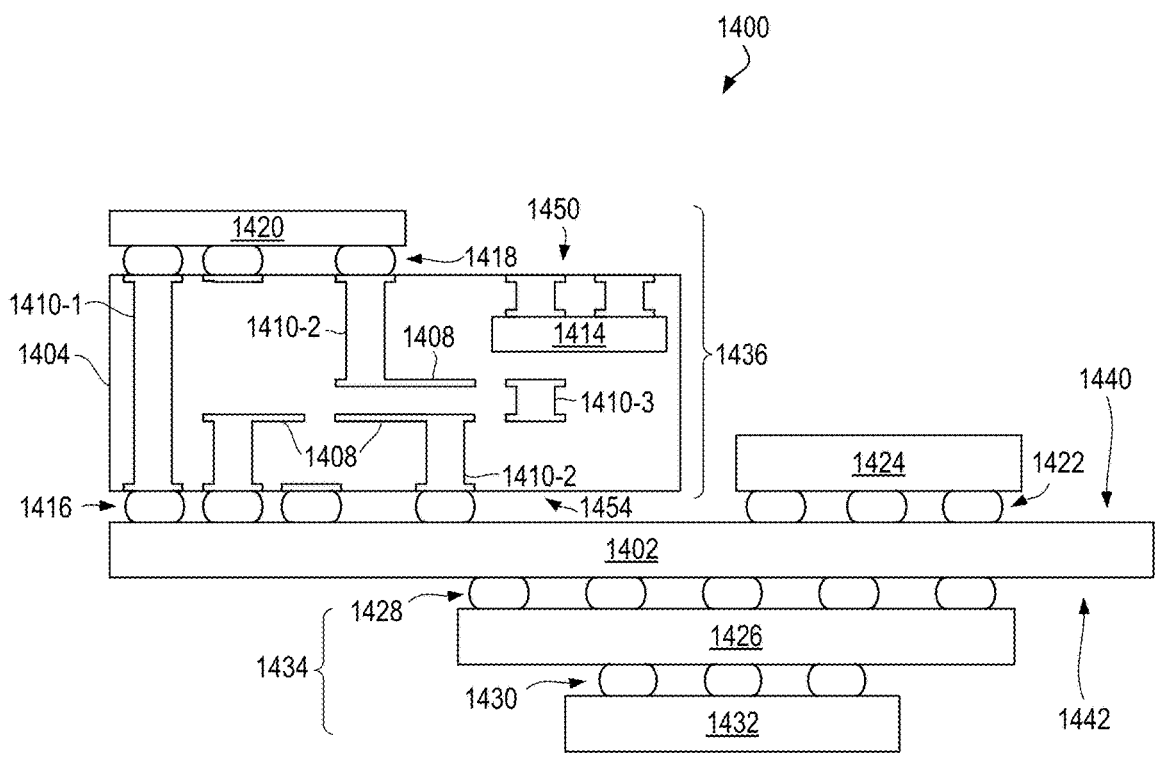
FIG. 14 is a cross-sectional side view of an integrated circuit device assembly that may include a microelectronic assembly, in accordance with any of the embodiments disclosed herein.

FIG. 14 is a cross-sectional side view of an integrated circuit device assembly 1400 that may include any of the architectures with conformal power delivery structures disclosed herein. In some embodiments, the integrated circuit device assembly 1400 may be a microelectronic assembly. The integrated circuit device assembly 1400 includes a number of components disposed on a circuit board 1402 (which may be a motherboard, system board, mainboard, etc.). The integrated circuit device assembly 1400 includes components disposed on a first face 1440 of the circuit board 1402 and an opposing second face 1442 of the circuit board 1402; generally, components may be disposed on one or both faces 1440 and 1442.

In some embodiments, the circuit board 1402 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 1402. In other embodiments, the circuit board 1402 may be a non-PCB substrate. The integrated circuit device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), pins (e.g., as part of a pin grid array (PGA), contacts (e.g., as part of a land grid array (LGA)), male and female portions of a socket, an adhesive, an underfill material, and/or any other suitable electrical and/or mechanical coupling structure.

The package-on-interposer structure 1436 may include an integrated circuit component 1420 coupled to an interposer 1404 by coupling components 1418. The coupling components 1418 may take any suitable form for the application, such as the forms discussed above with reference to the coupling components 1416. Although a single integrated circuit component 1420 is shown in FIG. 14, multiple integrated circuit components may be coupled to the interposer 1404; indeed, additional interposers may be coupled to the interposer 1404. The interposer 1404 may provide an intervening substrate used to bridge the circuit board 1402 and the integrated circuit component 1420.

The integrated circuit component 1420 may be a packaged or unpacked integrated circuit product that includes one or more integrated circuit dies (e.g., the die 1202 of FIG. 12, the integrated circuit device 1300 of FIG. 13) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 1420, a single monolithic integrated circuit die comprises solder bumps attached to contacts on the die. The solder bumps allow the die to be directly attached to the interposer 1404. The integrated circuit component 1420 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 1420 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 1420 comprises multiple integrated circuit dies, they dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 1420 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 1404 may spread connections to a wider pitch or reroute a connection to a different connection. For example, the interposer 1404 may couple the integrated circuit component 1420 to a set of ball grid array (BGA) conductive contacts of the coupling components 1416 for coupling to the circuit board 1402. In the embodiment illustrated in FIG. 14, the integrated circuit component 1420 and the circuit board 1402 are attached to opposing sides of the interposer 1404; in other embodiments, the integrated circuit component 1420 and the circuit board 1402 may be attached to a same side of the interposer 1404. In some embodiments, three or more components may be interconnected by way of the interposer 1404.

In some embodiments, the interposer 1404 may be formed as a PCB, including multiple metal layers separated from one another by layers of dielectric material and interconnected by electrically conductive vias. In some embodiments, the interposer 1404 may be formed of an epoxy resin, a fiberglass-reinforced epoxy resin, an epoxy resin with inorganic fillers, a ceramic material, or a polymer material such as polyimide. In some embodiments, the interposer 1404 may be formed of alternate rigid or flexible materials that may include the same materials described above for use in a semiconductor substrate, such as silicon, germanium, and other group III-V and group IV materials. The interposer 1404 may include metal interconnects 1408 and vias 1410, including but not limited to through hole vias 1410-1 (that extend from a first face 1450 of the interposer 1404 to a second face 1454 of the interposer 1404), blind vias 1410-2 (that extend from the first or second faces 1450 or 1454 of the interposer 1404 to an internal metal layer), and buried vias 1410-3 (that connect internal metal layers).

In some embodiments, the interposer 1404 can comprise a silicon interposer. Through silicon vias (TSV) extending through the silicon interposer can connect connections on a first face of a silicon interposer to an opposing second face of the silicon interposer. In some embodiments, an interposer 1404 comprising a silicon interposer can further comprise one or more routing layers to route connections on a first face of the interposer 1404 to an opposing second face of the interposer 1404.

The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art. In embodiments where the interposer is a non-printed circuit board The integrated circuit device assembly 1400 may include an integrated circuit component 1424 coupled to the first face 1440 of the circuit board 1402 by coupling components 1422. The coupling components 1422 may take the form of any of the embodiments discussed above with reference to the coupling components 1416, and the integrated circuit component 1424 may take the form of any of the embodiments discussed above with reference to the integrated circuit component 1420.

The integrated circuit device assembly 1400 illustrated in FIG. 14 includes a package-on-package structure 1434 coupled to the second face 1442 of the circuit board 1402 by coupling components 1428. The package-on-package structure 1434 may include an integrated circuit component 1426 and an integrated circuit component 1432 coupled together by coupling components 1430 such that the integrated circuit component 1426 is disposed between the circuit board 1402 and the integrated circuit component 1432. The coupling components 1428 and 1430 may take the form of any of the embodiments of the coupling components 1416 discussed above, and the integrated circuit components 1426 and 1432 may take the form of any of the embodiments of the integrated circuit component 1420 discussed above. The package-on-package structure 1434 may be configured in accordance with any of the package-on-package structures known in the art.

Figure 15:
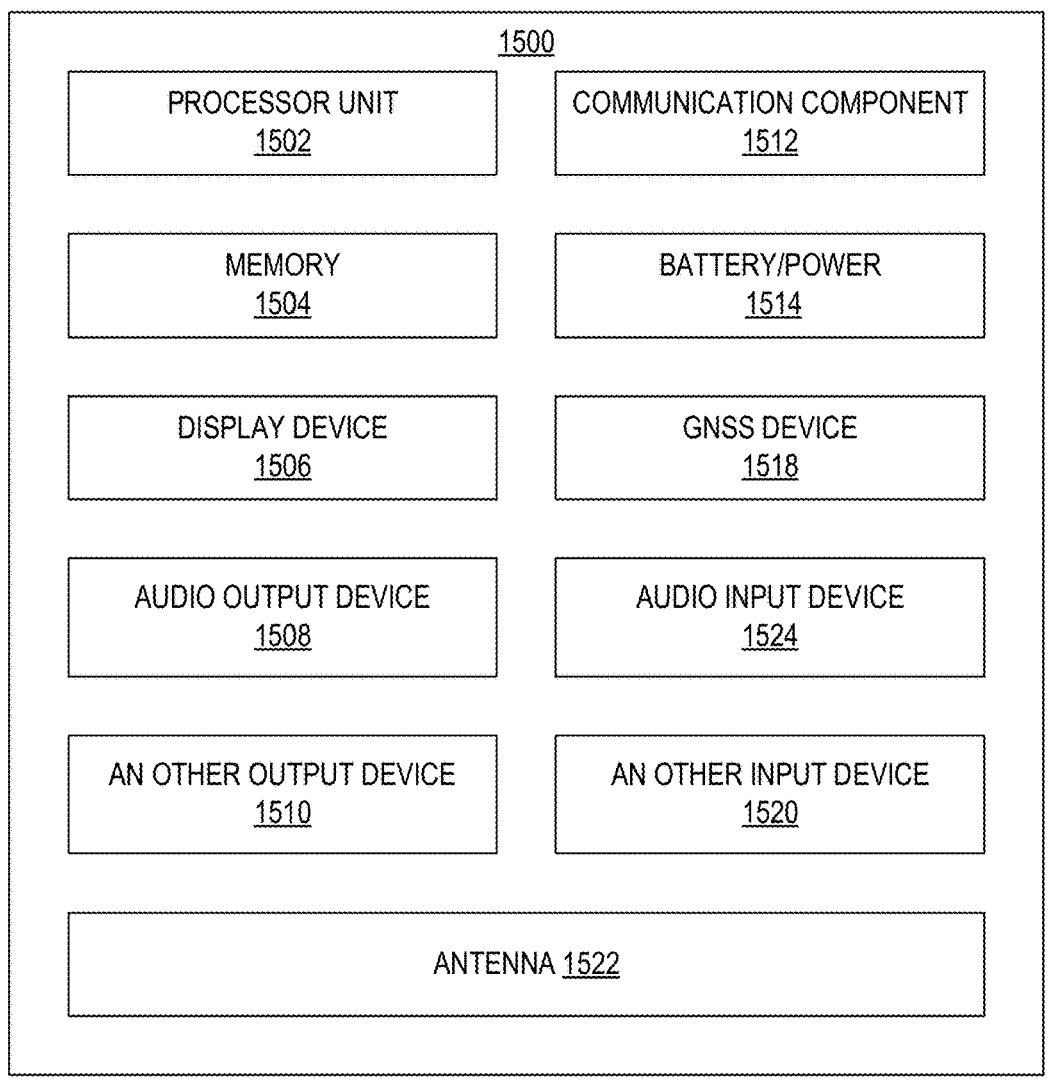
FIG. 15 is a block diagram of an example electrical device that may include a microelectronic assembly, in accordance with any of the embodiments disclosed herein.

FIG. 15 is a block diagram of an example electrical device 1500 that may include one or more of the architectures with conformal power delivery structures disclosed herein. For example, any suitable ones of the components of the electrical device 1500 may include one or more of the integrated circuit device assemblies 1400, integrated circuit components 1420, integrated circuit devices 1300, or integrated circuit dies 1202 disclosed herein. A number of components are illustrated in FIG. 15 as included in the electrical device 1500, but any one or more of these components may be omitted or duplicated, as suitable for the application. In some embodiments, some or all of the components included in the electrical device 1500 may be attached to one or more motherboards mainboards, or system boards. In some embodiments, one or more of these components are fabricated onto a single system-on-a-chip (SoC) die.

Additionally, in various embodiments, the electrical device 1500 may not include one or more of the components illustrated in FIG. 15, but the electrical device 1500 may include interface circuitry for coupling to the one or more components. For example, the electrical device 1500 may not include a display device 1506, but may include display device interface circuitry (e.g., a connector and driver circuitry) to which a display device 1506 may be coupled. In another set of examples, the electrical device 1500 may not include an audio input device 1524 or an audio output device 1508, but may include audio input or output device interface circuitry (e.g., connectors and supporting circuitry) to which an audio input device 1524 or audio output device 1508 may be coupled.

The electrical device 1500 may include one or more processor units 1502 (e.g., one or more processor units). As used herein, the terms "processor unit", "processing unit" or "processor" may refer to any device or portion of a device that processes electronic data from registers and/or memory to transform that electronic data into other electronic data that may be stored in registers and/or memory. The processor unit 1502 may include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

The electrical device 1500 may include a memory 1504, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-voltage memories), solid state memory, and/or a hard drive. In some embodiments, the memory 1504 may include memory that is located on the same integrated circuit die as the processor unit 1502. This memory may be used as cache memory (e.g., Level 1 (L1), Level 2 (L2), Level 3 (L3), Level 4 (L4), Last Level Cache (LLC)) and may include embedded dynamic random access memory (eDRAM) or spin transfer torque magnetic random access memory (STT-MRAM).

In some embodiments, the electrical device 1500 can comprise one or more processor units 1502 that are heterogeneous or asymmetric to another processor unit 1502 in the electrical device 1500. There can be a variety of differences between the processing units 1502 in a system in terms of a spectrum of metrics of merit including architectural, micro-architectural, thermal, power consumption characteristics, and the like. These differences can effectively manifest themselves as asymmetry and heterogeneity among the processor units 1502 in the electrical device 1500.

In some embodiments, the electrical device 1500 may include a communication component 1512 (e.g., one or more communication components). For example, the communication component 1512 can manage wireless communications for the transfer of data to and from the electrical device 1500. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 1512 may operate in accordance with other wireless protocols in other embodiments. The electrical device 1500 may include an antenna 1522 to facilitate wireless communications and/or to receive other wireless communications (such as AM or FM radio transmissions).

In some embodiments, the communication component 1512 may manage wired communications, such as electrical, optical, or any other suitable communication protocols (e.g., IEEE 802.3 Ethernet standards). As noted above, the communication component 1512 may include multiple communication components. For instance, a first communication component 1512 may be dedicated to shorter-range wireless communications such as Wi-Fi or Bluetooth, and a second communication component 1512 may be dedicated to longer-range wireless communications such as global positioning system (GPS), EDGE, GPRS, CDMA, WiMAX, LTE, EV-DO, or others. In some embodiments, a first communication component 1512 may be dedicated to wireless communications, and a second communication component 1512 may be dedicated to wired communications.

The electrical device 1500 may include battery/power circuitry 1514. The battery/power circuitry 1514 may include one or more energy storage devices (e.g., batteries or capacitors) and/or circuitry for coupling components of the electrical device 1500 to an energy source separate from the electrical device 1500 (e.g., AC line power).

The electrical device 1500 may include a display device 1506 (or corresponding interface circuitry, as discussed above). The display device 1506 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 1500 may include an audio output device 1508 (or corresponding interface circuitry, as discussed above). The audio output device 1508 may include any embedded or wired or wirelessly connected external device that generates an audible indicator, such speakers, headsets, or earbuds.

The electrical device 1500 may include an audio input device 1524 (or corresponding interface circuitry, as discussed above). The audio input device 1524 may include any embedded or wired or wirelessly connected device that generates a signal representative of a sound, such as microphones, microphone arrays, or digital instruments (e.g., instruments having a musical instrument digital interface (MIDI) output). The electrical device 1500 may include a Global Navigation Satellite System (GNSS) device 1518 (or corresponding interface circuitry, as discussed above), such as a Global Positioning System (GPS) device. The GNSS device 1518 may be in communication with a satellite-based system and may determine a geolocation of the electrical device 1500 based on information received from one or more GNSS satellites, as known in the art.

The electrical device 1500 may include an other output device 1510 (or corresponding interface circuitry, as discussed above). Examples of the other output device 1510 may include an audio codec, a video codec, a printer, a wired or wireless transmitter for providing information to other devices, or an additional storage device.

The electrical device 1500 may include an other input device 1520 (or corresponding interface circuitry, as discussed above). Examples of the other input device 1520 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 1500 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 1500 may be any other electronic device that processes data. In some embodiments, the electrical device 1500 may comprise multiple discrete physical components. Given the range of devices that the electrical device 1500 can be manifested as in various embodiments, in some embodiments, the electrical device 1500 can be referred to as a computing device or a computing system.

Some examples of embodiments are provided below. As used in the following examples, the term "connected" may refer to an electrical connection. In some instances, the connection may be a direct connection between two items/components. Further, as used in the following examples, the term "coupled" may refer to a connection that may be direct or indirect. For example, a first component coupled to a second component may include a third component connected between the first and second components.

Example 1 includes an apparatus comprising: first connection pads on a first surface of the apparatus; second connection pads on a second surface of the apparatus opposite the first surface; a conformal power delivery structure comprising: a first electrically conductive layer comprising metal, the first electrically conductive layer defining one or more recesses; a second electrically conductive layer comprising metal, the second electrically conductive layer at least partially within the recesses of the first electrically conductive layer and having a lower surface that generally conforms with the upper surface of the first electrically conductive layer; and a dielectric material between the surfaces of the first electrically conductive layer and the second electrically conductive layer that conform with one another; wherein the first electrically conductive layer is connected to a first set of the first connection pads, and the second electrically conductive layer is connected to a second set of the first connection pads and to a set of the second connection pads; and bridge circuitry to connect a first integrated circuit (IC) chip with a second IC chip, the bridge circuitry connected to a third set of first connection pads different from the first set and the second set of first connection pads.

Example 2 includes the subject matter of Example 1, wherein the first electrically conductive layer comprises a first portion and a second portion electrically isolated from one another, the first portion connected to the first set of the first connection pads and the second portion connected to a second set of the second connection pads.

Example 3 includes the subject matter of Example 1, wherein conformal power delivery structure is a first conformal power delivery structure, and the apparatus further comprises a second conformal power delivery structure comprising: a third electrically conductive layer comprising metal, the third electrically conductive layer defining one or more recesses; a fourth electrically conductive layer comprising metal, the fourth electrically conductive layer at least partially within the recesses of the third electrically conductive layer and having a lower surface that generally conforms with the upper surface of the third electrically conductive layer; and a dielectric material between the surfaces of the third electrically conductive layer and the fourth electrically conductive layer that conform with one another; wherein the third electrically conductive layer is connected to a second set of the second connection pads and the fourth electrically conductive layer is connected to a fourth set of the second connection pads.

Example 4 includes the subject matter of Example 1, wherein: the second electrically conductive layer defines one or more recesses; and the conformal power delivery structure comprises: a third electrically conductive layer comprising metal, the third electrically conductive layer at least partially within the recesses of the second electrically conductive layer and having a lower surface that generally conforms with the upper surface of the second electrically conductive layer; a dielectric material between the surfaces of the second electrically conductive layer and the third electrically conductive layer that conform with one another;

and the third electrically conductive layer is connected to a second set of the second connection pads.

Example 5 includes the subject matter of any one of Examples 1-4, further comprising a redistribution layer connected to at least one of the first connection pads.

Example 6 includes the subject matter of any one of Examples 1-5, further comprising a redistribution layer connected to at least one of the second connection pads.

Example 7 includes the subject matter of any one of Examples 1-6, further comprising a set of pillars between respective pairs of the first connection pads and the second connection pads, the pillars comprising metal.

Example 8 includes the subject matter of any one of Examples 1-7, wherein the first connection pads have a pitch between approximately 10-150 um, and the second connection pads have a pitch between approximately 150-250 um.

Example 9 includes a chip package comprising: a first integrated circuit (IC) chip; a second IC chip; base die apparatus connected to the first and second IC chips through first connection pads on a first surface of the base die apparatus, the base die apparatus comprising: bridge circuitry connected to each of the first and second IC chips; a conformal power delivery structure comprising: a first electrically conductive layer comprising metal, the first electrically conductive layer defining one or more recesses; a second electrically conductive layer comprising metal, the second electrically conductive layer at least partially within the recesses of the first electrically conductive layer and having a lower surface that generally conforms with the upper surface of the first electrically conductive layer; and a dielectric material between the surfaces of the first electrically conductive layer and the second electrically conductive layer that conform with one another; wherein the first electrically conductive layer and second electrically conductive layer of the conformal power delivery structure are each connected to one or both of the first IC chip and the second IC chip; and second connection pads on a second surface of the base die apparatus opposite the first surface.

Example 10 includes the subject matter of Example 9, wherein: the first IC chip comprises voltage regulator circuitry; and the first electrically conductive layer comprises a first portion and a second portion electrically isolated from one another, the first portion connected to an output voltage terminal of the voltage regulator circuitry and to processor circuitry of one or both of the first IC chip and the second IC chip, the second portion connected to a set of the second connection pads and to an input voltage terminal of the voltage regulator circuitry.

Example 11 includes the subject matter of Example 9, wherein: the first IC chip comprises voltage regulator circuitry; and the conformal power delivery structure is a first conformal power delivery structure, and the apparatus further comprises a second conformal power delivery structure comprising: a third electrically conductive layer comprising metal, the third electrically conductive layer defining one or more recesses; a fourth electrically conductive layer comprising metal, the fourth electrically conductive layer at least partially within the recesses of the third electrically conductive layer and having a lower surface that generally conforms with the upper surface of the third electrically conductive layer; and a dielectric material between the surfaces of the third electrically conductive layer and the fourth electrically conductive layer that conform with one another; wherein the third electrically conductive layer is connected to a set of the second connection pads and to an input voltage terminal of the voltage regulator circuitry, and the first electrically conductive layer is connected to an output voltage terminal of the voltage regulator circuitry and to processor circuitry of one or both of the first IC chip and the second IC chip.

Example 12 includes the subject matter of Example 9, wherein: the first IC chip comprises voltage regulator circuitry; and the second electrically conductive layer defines one or more recesses; and the conformal power delivery structure comprises: a third electrically conductive layer comprising metal, the third electrically conductive layer at least partially within the recesses of the second electrically conductive layer and having a lower surface that generally conforms with the upper surface of the second electrically conductive layer; a dielectric material between the surfaces of the second electrically conductive layer and the third electrically conductive layer that conform with one another; the third electrically conductive layer is connected to a set of the second connection pads and to an input voltage terminal of the voltage regulator circuitry, and the first electrically conductive layer is connected to an output voltage terminal of the voltage regulator circuitry and to processor circuitry of one or both of the first IC chip and the second IC chip.

Example 13 includes the subject matter of any one of Examples 9-12, further comprising a redistribution layer connected to at least one of the first connection pads.

Example 14 includes the subject matter of any one of Examples 9-13, further comprising a redistribution layer connected to at least one of the second connection pads.

Example 15 includes the subject matter of any one of Examples 9-14, further comprising a set of pillars between respective pairs of the first connection pads and the second connection pads, the pillars comprising metal.

Example 16 includes the subject matter of any one of Examples 9-15, wherein the first connection pads have a pitch between approximately 10-150 um, and the second connection pads have a pitch between approximately 150-250 um.

Example 17 includes a system comprising: a main circuit board comprising a power delivery structure; a PMIC connected to the power delivery structure of the main circuit board; a base die apparatus connected to the main circuit board; and a first integrated circuit (IC) chip and a second IC chip connected to the base die; wherein the base die apparatus comprises: bridge circuitry connected to each of the first and second IC chips; a conformal power delivery structure connected to the power delivery structure of the main board, the conformal power delivery structure comprising: a first electrically conductive layer comprising metal, the first electrically conductive layer defining one or more recesses; a second electrically conductive layer comprising metal, the second electrically conductive layer at least partially within the recesses of the first electrically conductive layer and having a lower surface that generally conforms with the upper surface of the first electrically conductive layer; and a dielectric material between the surfaces of the first electrically conductive layer and the second electrically conductive layer that conform with one another; wherein the first electrically conductive layer and second electrically conductive layer of the conformal power delivery structure are connected to one or both of the first IC chip and the second IC chip.

Example 18 includes the subject matter of Example 17, further comprising voltage regulator circuitry to receive a voltage from the PMIC and provide an output voltage based on the voltage from the PMIC.

Example 19 includes the subject matter of Example 18, wherein the base die apparatus further comprises voltage regulator circuitry is in one of the first IC chip or the second IC chip.

Example 20 includes the subject matter of Example 18 or 19, wherein the first electrically conductive layer comprises a first portion and a second portion electrically isolated from one another, the first portion connected to an output voltage terminal of the voltage regulator circuitry and to processor circuitry of one or both of the first IC chip and the second IC chip, the second portion connected to an output voltage terminal of the PMIC and to an input voltage terminal of the voltage regulator circuitry.

Example 21 includes the subject matter of Example 18 or 19, wherein conformal power delivery structure is a first conformal power delivery structure, and the apparatus further comprises a second conformal power delivery structure comprising: a third electrically conductive layer comprising metal, the third electrically conductive layer defining one or more recesses; a fourth electrically conductive layer comprising metal, the fourth electrically conductive layer at least partially within the recesses of the third electrically conductive layer and having a lower surface that generally conforms with the upper surface of the third electrically conductive layer; and a dielectric material between the surfaces of the third electrically conductive layer and the fourth electrically conductive layer that conform with one another; wherein the third electrically conductive layer is connected to an output voltage terminal of the PMIC and to an input voltage terminal of the voltage regulator circuitry, and the first electrically conductive layer is connected to an output voltage terminal of the voltage regulator circuitry and to processor circuitry of one or both of the first IC chip and the second IC chip.

Example 22 includes the subject matter of Example 18 or 19, wherein: the second electrically conductive layer defines one or more recesses; and the conformal power delivery structure comprises: a third electrically conductive layer comprising metal, the third electrically conductive layer at least partially within the recesses of the second electrically conductive layer and having a lower surface that generally conforms with the upper surface of the second electrically conductive layer; a dielectric material between the surfaces of the second electrically conductive layer and the third electrically conductive layer that conform with one another; and the third electrically conductive layer is connected to an output voltage terminal of the PMIC and to an input voltage terminal of the voltage regulator circuitry, and the first electrically conductive layer is connected to an output voltage terminal of the voltage regulator circuitry and to processor circuitry of one or both of the first IC chip and the second IC chip.

Example 23 includes the subject matter of any one of Examples 17-22, wherein the base die apparatus further comprises a set of pillars connecting one or both of the first IC chip or second IC chip to IO circuitry of the main board.

Example 24 includes the subject matter of any one of Examples 17-23, wherein a pitch of first connection pads of the base die apparatus interfacing with the first and second IC chips is between approximately 10-150 um, and a pitch of first connection pads of the base die apparatus interfacing with the main board is between approximately 150-250 um Example 25 includes the subject matter of any one of Examples 17-23, further comprising a package substrate connected between the base die apparatus and the first and second IC chips, the package substrate comprising a second power delivery structure connected between the conformal power delivery structure of the base die apparatus and the power delivery structure of the main board.

In the foregoing, a detailed description has been given with reference to specific example embodiments. It will, however, be evident that various modifications and changes may be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment(s) and other exemplarily language does not necessarily refer to the same embodiment or the same example, but may refer to different and distinct embodiments, as well as potentially the same embodiment.

The invention claimed is:

1. An apparatus comprising:
   first connection pads on a first surface of the apparatus;
   second connection pads on a second surface of the apparatus opposite the first surface;
   a conformal power delivery structure comprising:
      a first electrically conductive layer comprising metal, the first electrically conductive layer defining one or more recesses;
      a second electrically conductive layer comprising metal, the second electrically conductive layer at least partially within the recesses of the first electrically conductive layer and having a lower surface that generally conforms with an upper surface of the first electrically conductive layer; and
      a dielectric material between the surfaces of the first electrically conductive layer and the second electrically conductive layer that conform with one another;
      wherein the first electrically conductive layer is connected to a first set of the first connection pads, and the second electrically conductive layer is connected to a second set of the first connection pads and to a set of the second connection pads; and
   bridge circuitry to connect a first integrated circuit (IC) chip with a second IC chip, the bridge circuitry connected to a third set of first connection pads different from the first set and the second set of first connection pads.

2. The apparatus of claim 1, wherein the first electrically conductive layer comprises a first portion and a second portion electrically isolated from one another, the first portion connected to the first set of the first connection pads and the second portion connected to a second set of the second connection pads.

3. The apparatus of claim 1, wherein conformal power delivery structure is a first conformal power delivery structure, and the apparatus further comprises a second conformal power delivery structure comprising:
   a third electrically conductive layer comprising metal, the third electrically conductive layer defining one or more recesses;
   a fourth electrically conductive layer comprising metal, the fourth electrically conductive layer at least partially within the recesses of the third electrically conductive layer and having a lower surface that generally conforms with an upper surface of the third electrically conductive layer; and
   a dielectric material between the surfaces of the third electrically conductive layer and the fourth electrically conductive layer that conform with one another;
   wherein the third electrically conductive layer is connected to a second set of the second connection pads and the fourth electrically conductive layer is connected to a fourth set of the second connection pads.

4. The apparatus of claim 1, wherein:
the second electrically conductive layer defines one or more recesses; and
the conformal power delivery structure comprises:
  a third electrically conductive layer comprising metal, the third electrically conductive layer at least partially within the recesses of the second electrically conductive layer and having a lower surface that generally conforms with an upper surface of the second electrically conductive layer;
  a dielectric material between the surfaces of the second electrically conductive layer and the third electrically conductive layer that conform with one another; and
the third electrically conductive layer is connected to a second set of the second connection pads.

5. The apparatus of claim 1, further comprising a redistribution layer connected to at least one of the first connection pads.

6. The apparatus of claim 1, further comprising a redistribution layer connected to at least one of the second connection pads.

7. The apparatus of claim 1, further comprising a set of pillars between respective pairs of the first connection pads and the second connection pads, the pillars comprising metal.

8. The apparatus of claim 1, wherein the first connection pads have a pitch between approximately 10-150 um, and the second connection pads have a pitch between approximately 150-250 um.

9. A chip package comprising:
a first integrated circuit (IC) chip;
a second IC chip;
base die apparatus connected to the first and second IC chips through first connection pads on a first surface of the base die apparatus, the base die apparatus comprising:
  bridge circuitry connected to each of the first and second IC chips;
  a conformal power delivery structure comprising:
    a first electrically conductive layer comprising metal, the first electrically conductive layer defining one or more recesses;
    a second electrically conductive layer comprising metal, the second electrically conductive layer at least partially within the recesses of the first electrically conductive layer and having a lower surface that generally conforms with an upper surface of the first electrically conductive layer; and
    a dielectric material between the surfaces of the first electrically conductive layer and the second electrically conductive layer that conform with one another;
  wherein the first electrically conductive layer and second electrically conductive layer of the conformal power delivery structure are each connected to one or both of the first IC chip and the second IC chip; and
  second connection pads on a second surface of the base die apparatus opposite the first surface.

10. The chip package of claim 9, wherein:
the first IC chip comprises voltage regulator circuitry; and
the first electrically conductive layer comprises a first portion and a second portion electrically isolated from one another, the first portion connected to an output voltage terminal of the voltage regulator circuitry and to processor circuitry of one or both of the first IC chip and the second IC chip, the second portion connected to a set of the second connection pads and to an input voltage terminal of the voltage regulator circuitry.

11. The chip package of claim 9, wherein:
the first IC chip comprises voltage regulator circuitry; and
the conformal power delivery structure is a first conformal power delivery structure, and the apparatus further comprises a second conformal power delivery structure comprising:
  a third electrically conductive layer comprising metal, the third electrically conductive layer defining one or more recesses;
  a fourth electrically conductive layer comprising metal, the fourth electrically conductive layer at least partially within the recesses of the third electrically conductive layer and having a lower surface that generally conforms with an upper surface of the third electrically conductive layer; and
  a dielectric material between the surfaces of the third electrically conductive layer and the fourth electrically conductive layer that conform with one another;
wherein the third electrically conductive layer is connected to a set of the second connection pads and to an input voltage terminal of the voltage regulator circuitry, and the first electrically conductive layer is connected to an output voltage terminal of the voltage regulator circuitry and to processor circuitry of one or both of the first IC chip and the second IC chip.

12. The chip package of claim 9, wherein:
the first IC chip comprises voltage regulator circuitry; and
the second electrically conductive layer defines one or more recesses; and
the conformal power delivery structure comprises:
  a third electrically conductive layer comprising metal, the third electrically conductive layer at least partially within the recesses of the second electrically conductive layer and having a lower surface that generally conforms with an upper surface of the second electrically conductive layer;
  a dielectric material between the surfaces of the second electrically conductive layer and the third electrically conductive layer that conform with one another;
the third electrically conductive layer is connected to a set of the second connection pads and to an input voltage terminal of the voltage regulator circuitry, and the first electrically conductive layer is connected to an output voltage terminal of the voltage regulator circuitry and to processor circuitry of one or both of the first IC chip and the second IC chip.

13. The chip package of claim 9, further comprising a redistribution layer connected to at least one of the first connection pads.

14. The chip package of claim 9, further comprising a redistribution layer connected to at least one of the second connection pads.

15. The chip package of claim 9, further comprising a set of pillars between respective pairs of the first connection pads and the second connection pads, the pillars comprising metal.

16. The chip package of claim 9, wherein the first connection pads have a pitch between approximately 10-150 um, and the second connection pads have a pitch between approximately 150-250 um.

17. A system comprising:
a main circuit board comprising a power delivery structure;
a PMIC connected to the power delivery structure of the main circuit board;
a base die apparatus connected to the main circuit board; and
a first integrated circuit (IC) chip and a second IC chip connected to the base die;
wherein the base die apparatus comprises:
bridge circuitry connected to each of the first and second IC chips;
a conformal power delivery structure connected to the power delivery structure of the main board, the conformal power delivery structure comprising:
a first electrically conductive layer comprising metal, the first electrically conductive layer defining one or more recesses;
a second electrically conductive layer comprising metal, the second electrically conductive layer at least partially within the recesses of the first electrically conductive layer and having a lower surface that generally conforms with an upper surface of the first electrically conductive layer; and
a dielectric material between the surfaces of the first electrically conductive layer and the second electrically conductive layer that conform with one another;
wherein the first electrically conductive layer and second electrically conductive layer of the conformal power delivery structure are connected to one or both of the first IC chip and the second IC chip.

18. The system of claim 17, further comprising voltage regulator circuitry to receive a voltage from the PMIC and provide an output voltage based on the voltage from the PMIC.

19. The system of claim 18, wherein the base die apparatus further comprises voltage regulator circuitry is in one of the first IC chip or the second IC chip.

20. The system of claim 18, wherein the first electrically conductive layer comprises a first portion and a second portion electrically isolated from one another, the first portion connected to an output voltage terminal of the voltage regulator circuitry and to processor circuitry of one or both of the first IC chip and the second IC chip, the second portion connected to an output voltage terminal of the PMIC and to an input voltage terminal of the voltage regulator circuitry.

21. The system of claim 18, wherein conformal power delivery structure is a first conformal power delivery structure, and the apparatus further comprises a second conformal power delivery structure comprising:

a third electrically conductive layer comprising metal, the third electrically conductive layer defining one or more recesses;
a fourth electrically conductive layer comprising metal, the fourth electrically conductive layer at least partially within the recesses of the third electrically conductive layer and having a lower surface that generally conforms with an upper surface of the third electrically conductive layer; and
a dielectric material between the surfaces of the third electrically conductive layer and the fourth electrically conductive layer that conform with one another;
wherein the third electrically conductive layer is connected to an output voltage terminal of the PMIC and to an input voltage terminal of the voltage regulator circuitry, and the first electrically conductive layer is connected to an output voltage terminal of the voltage regulator circuitry and to processor circuitry of one or both of the first IC chip and the second IC chip.

22. The system of claim 18, wherein:
the second electrically conductive layer defines one or more recesses; and
the conformal power delivery structure comprises:
a third electrically conductive layer comprising metal, the third electrically conductive layer at least partially within the recesses of the second electrically conductive layer and having a lower surface that generally conforms with an upper surface of the second electrically conductive layer;
a dielectric material between the surfaces of the second electrically conductive layer and the third electrically conductive layer that conform with one another; and
the third electrically conductive layer is connected to an output voltage terminal of the PMIC and to an input voltage terminal of the voltage regulator circuitry, and the first electrically conductive layer is connected to an output voltage terminal of the voltage regulator circuitry and to processor circuitry of one or both of the first IC chip and the second IC chip.

23. The system of claim 17, wherein the base die apparatus further comprises a set of pillars connecting one or both of the first IC chip or second IC chip to IO circuitry of the main board.

24. The system of claim 17, wherein a pitch of first connection pads of the base die apparatus interfacing with the first and second IC chips is between approximately 10-150 um, and a pitch of second connection pads of the base die apparatus interfacing with the main board is between approximately 150-250 um.

25. The system of claim 17, further comprising a package substrate connected between the base die apparatus and the first and second IC chips, the package substrate comprising a second power delivery structure connected between the conformal power delivery structure of the base die apparatus and the power delivery structure of the main board.

* * * * *